(12) United States Patent
Meiser et al.

(10) Patent No.: US 10,734,484 B2
(45) Date of Patent: Aug. 4, 2020

(54) SILICON CARBIDE SEMICONDUCTOR DEVICE WITH TRENCH GATE STRUCTURE AND HORIZONTALLY ARRANGED CHANNEL AND CURRENT SPREAD REGIONS

(71) Applicant: Infineon Technologies AG, Neubiberg (DE)

(72) Inventors: Andreas Meiser, Sauerlach (DE); Anton Mauder, Kolbermoor (DE); Roland Rupp, Lauf (DE); Oana Julia Spulber, Neubiberg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/358,929

(22) Filed: Mar. 20, 2019

(65) Prior Publication Data
US 2019/0296110 A1    Sep. 26, 2019

(30) Foreign Application Priority Data

Mar. 21, 2018   (DE) .......................... 10 2018 106 689

(51) Int. Cl.
*H01L 31/0256*   (2006.01)
*H01L 21/336*    (2006.01)
(Continued)

(52) U.S. Cl.
CPC ...... *H01L 29/1608* (2013.01); *H01L 21/2251* (2013.01); *H01L 29/0619* (2013.01); *H01L 29/0865* (2013.01); *H01L 29/1033* (2013.01); *H01L 29/4236* (2013.01); *H01L 29/66068* (2013.01); *H01L 29/7811* (2013.01); *H01L 29/7813* (2013.01)

(58) Field of Classification Search
CPC ............. H01L 21/2251; H01L 29/1608; H01L 29/0619; H01L 29/0865; H01L 29/1033; H01L 29/4236; H01L 29/66068; H01L 29/7811; H01L 29/7813
USPC ........................................... 257/77; 438/270
See application file for complete search history.

(56) References Cited

U.S. PATENT DOCUMENTS

| 6,525,375 B1 * | 2/2003 | Yamaguchi ....... H01L 29/66348 257/329 |
| 2002/0155685 A1 | 10/2002 | Sakakibara |

(Continued)

FOREIGN PATENT DOCUMENTS

DE    102014119465 B3    5/2016

*Primary Examiner* — David S Blum
(74) *Attorney, Agent, or Firm* — Murphy, Bilak & Homiller, PLLC

(57) ABSTRACT

A semiconductor device includes trench gate structures that extend from a first surface into a silicon carbide portion. A shielding region between a drift zone and the trench gate structures along a vertical direction orthogonal to the first surface forms an auxiliary pn junction with the drift zone. Channel regions and the trench gate structures are successively arranged along a first horizontal direction. The channel regions are arranged between a source region and a current spread region along a second horizontal direction orthogonal to the first horizontal direction. Portions of mesa sections between neighboring trench gate structures fully deplete at a gate voltage within an absolute maximum rating of the semiconductor device.

24 Claims, 23 Drawing Sheets

(51) Int. Cl.
*H01L 29/16* (2006.01)
*H01L 29/78* (2006.01)
*H01L 29/06* (2006.01)
*H01L 29/423* (2006.01)
*H01L 29/08* (2006.01)
*H01L 29/66* (2006.01)
*H01L 21/225* (2006.01)
*H01L 29/10* (2006.01)

(56) References Cited

U.S. PATENT DOCUMENTS

2016/0190301 A1* 6/2016 Aichinger ........... H01L 29/0696
257/77
2017/0263712 A1* 9/2017 Siemieniec .......... H03K 17/145

* cited by examiner

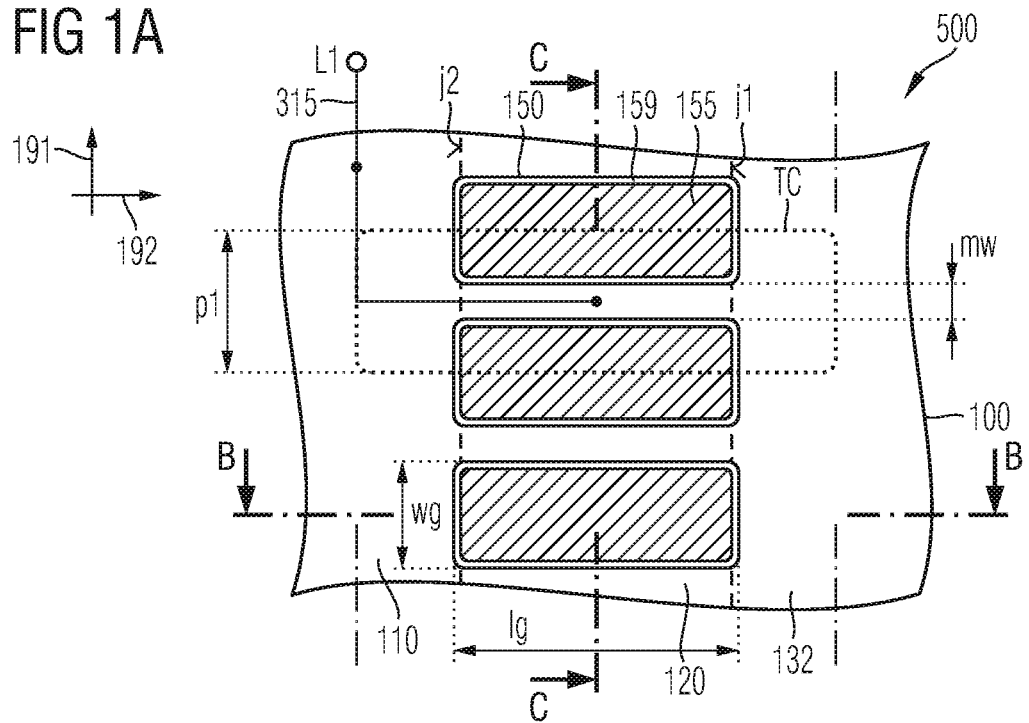
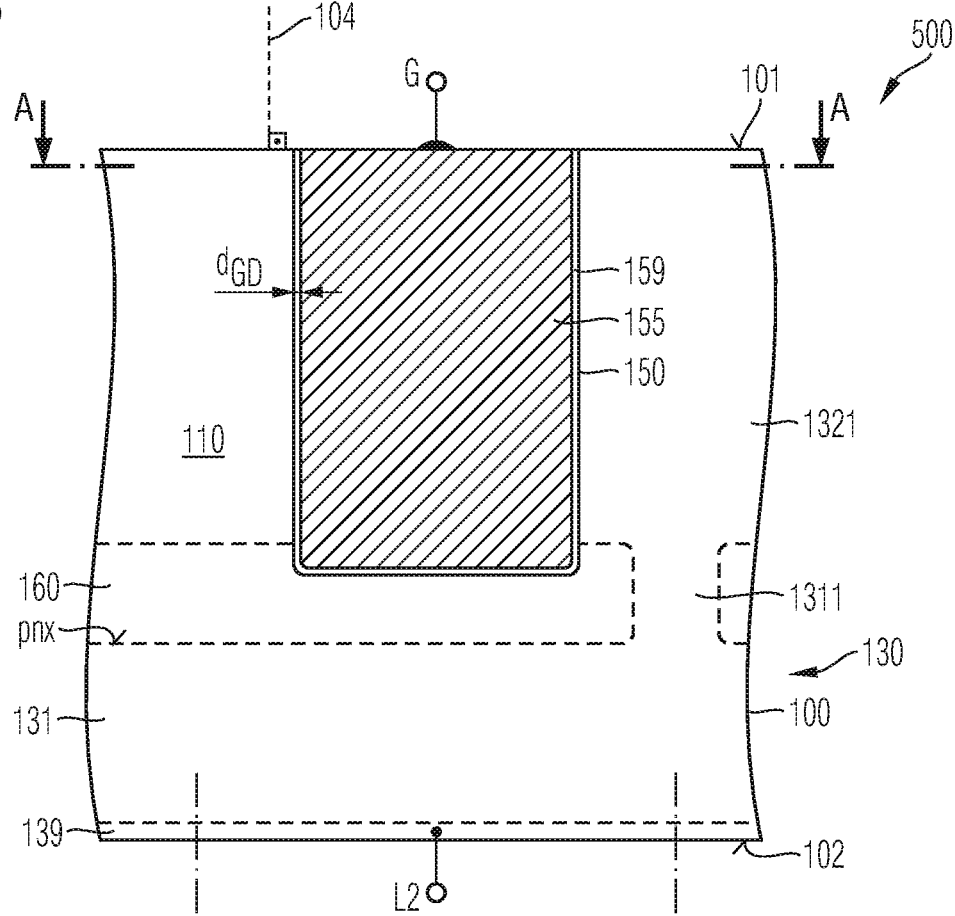

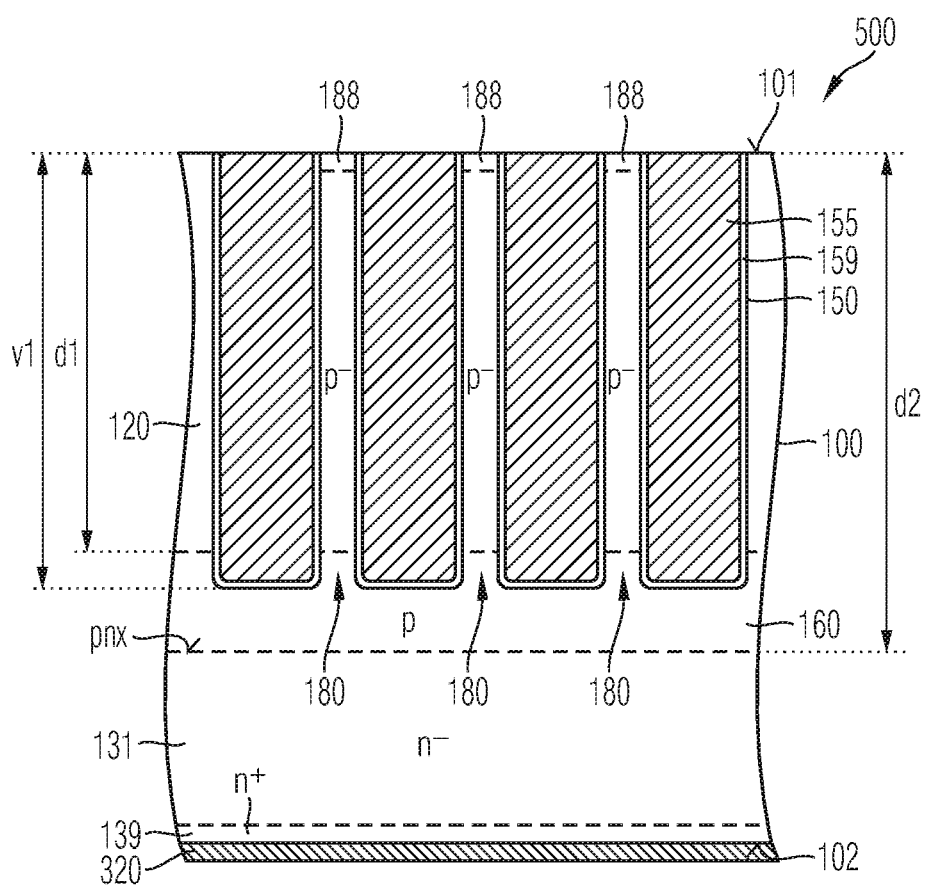

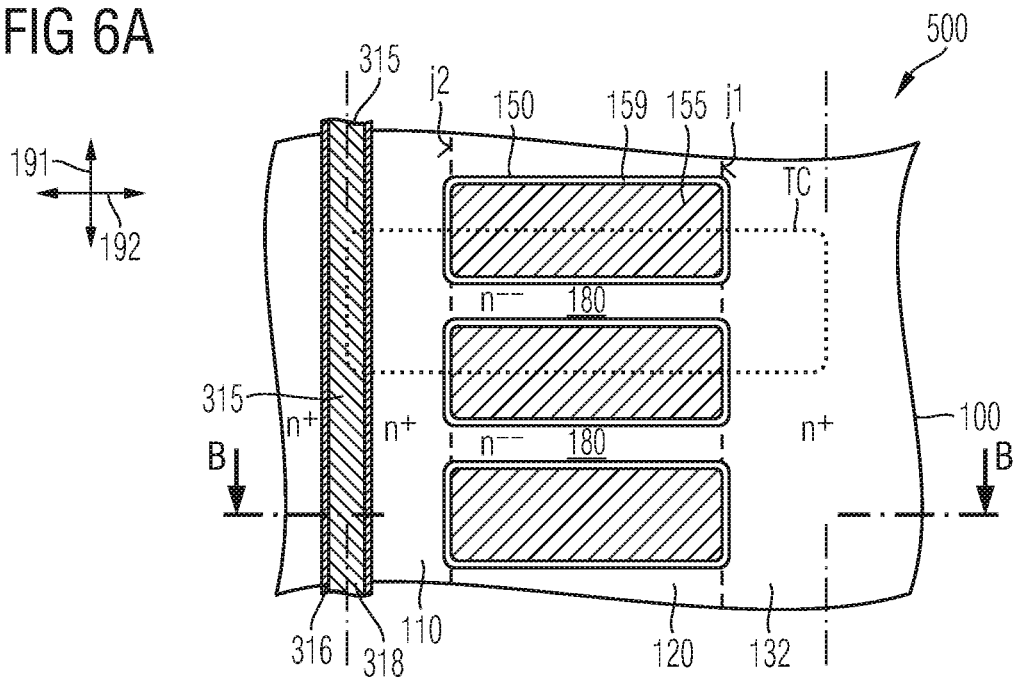
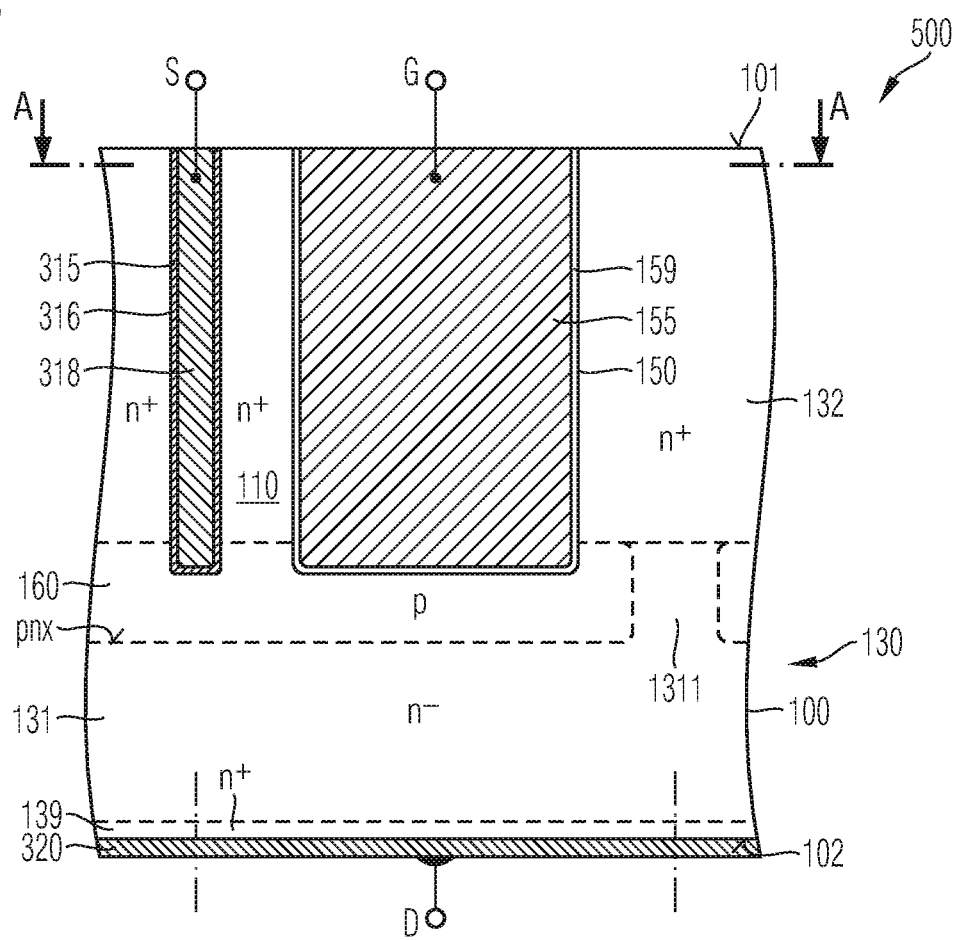

SILICON CARBIDE SEMICONDUCTOR DEVICE WITH TRENCH GATE STRUCTURE AND HORIZONTALLY ARRANGED CHANNEL AND CURRENT SPREAD REGIONS

BACKGROUND

In vertical power semiconductor devices a load current flows between a first surface at a front side and a second surface on the back of a semiconductor die. Since the dielectric breakdown field strength in silicon carbide is significantly higher than in silicon, silicon carbide semiconductor devices can be significantly thinner than equivalent silicon devices for the same blocking voltage. Therefore silicon carbide semiconductor devices can combine high breakdown voltages of more than 600 V with significantly lower on-state resistance than their silicon counter parts. Due to the comparatively thin drift zone, the comparatively low charge carrier mobility in the channel region dominates the on-state resistance of vertical silicon carbide devices at least for voltage classes with blocking voltages up to 1200 V.

There is a need for vertical semiconductor devices which combine materials with high dielectric breakdown field strength with low RDSon.

SUMMARY

Embodiments of the present disclosure relate to a semiconductor device including trench gate structures that extend from a first surface into a silicon carbide portion. Along a vertical direction orthogonal to the first surface, a shielding region is formed between a drift zone and the trench gate structures. The shielding region forms an auxiliary pn junction with the drift zone. Channel regions and the trench gate structures are successively arranged along a first horizontal direction, wherein along a second horizontal direction orthogonal to the first horizontal direction the channel regions are arranged between a source region and a current spread region. The channel regions are configured to fully deplete portions of mesa sections between neighboring trench gate structures at a gate voltage VGS within an absolute maximum rating of the semiconductor device.

Further embodiments of the present disclosure relate to a semiconductor device including trench gate structures that extend from a first surface into a silicon carbide portion. Along a vertical direction orthogonal to the first surface, a shielding region is formed between a drift zone and the trench gate structures. The shielding region forms an auxiliary pn junction with the drift zone. Channel regions and the trench gate structures are successively arranged along a first horizontal direction, wherein along a second horizontal direction orthogonal to the first horizontal direction the channel regions are arranged between a source region and a current spread region. The channel regions are configured to form bulk channels comprising a charge carrier flow in central portions of mesa sections between neighboring trench gate structures at a gate voltage VGS within an absolute maximum rating of the semiconductor device.

Further embodiments of the present disclosure relate to a method of manufacturing semiconductor devices. In a silicon carbide substrate, a shielding region is formed that forms an auxiliary pn junction with a drift zone. In a portion of the silicon carbide substrate between a main surface and the shielding region, a source region and a current spread region are formed, wherein longitudinal axes of the source region and the current spread region run parallel to a first horizontal direction. Between the source region and the current spread region, trench gate structures are formed that extend from the main surface into the silicon carbide substrate, wherein the trench gate structures alternate with mesa sections of the silicon carbide substrate along the first horizontal direction A mesa width of the mesa sections is at most 50 nm.

Further embodiments are described in the following detailed description and the claims. Those skilled in the art will recognize additional features and advantages upon reading the following detailed description and on viewing the accompanying drawings.

BRIEF DESCRIPTION OF THE DRAWINGS

The accompanying drawings are included to provide a further understanding of the present embodiments and are incorporated in and constitute a part of this specification. The drawings illustrate the present embodiments and together with the description serve to explain principles of the embodiments. Further embodiments and intended advantages will be readily appreciated as they become better understood by reference to the following detailed description.

FIG. 1A is a schematic horizontal cross-sectional view of a portion of a vertical power semiconductor device with trench gate structures and fully depleted channel region according to an embodiment.

FIG. 1B is a schematic vertical cross-sectional view of the semiconductor device portion of FIG. 1A along line B-B.

FIG. 5C is a schematic vertical cross-sectional view of the semiconductor device portion of FIG. 5A along line C-C.

FIG. 6A is a schematic vertical cross-sectional view of a portion of a semiconductor device according to an embodiment related to a deep source contact.

FIG. 6B is a schematic vertical cross-sectional view of the semiconductor device portion of FIG. 6A along line B-B.

DETAILED DESCRIPTION

In the following detailed description, reference is made to the accompanying drawings, which form a part hereof and in which are shown specific embodiments by way of illustrations. It is to be understood that other embodiments may be utilized and structural or logical changes may be made without departing from the scope of the present disclosure. For example, features illustrated or described for one embodiment can be used on or in conjunction with other embodiments to yield yet a further embodiment. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The term "electrically connected" describes a permanent low-resistive connection between electrically connected elements, for example a direct contact between the concerned elements or a low-resistive connection via a metal and/or heavily-doped semiconductor material. The term "electrically coupled" includes that one or more intervening element(s) adapted for signal transmission may be between the electrically coupled elements, for example, elements that are controllable to temporarily provide a low-resistive connection in a first state and a high-resistive electric decoupling in a second state.

The Figures illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Figure 1C:
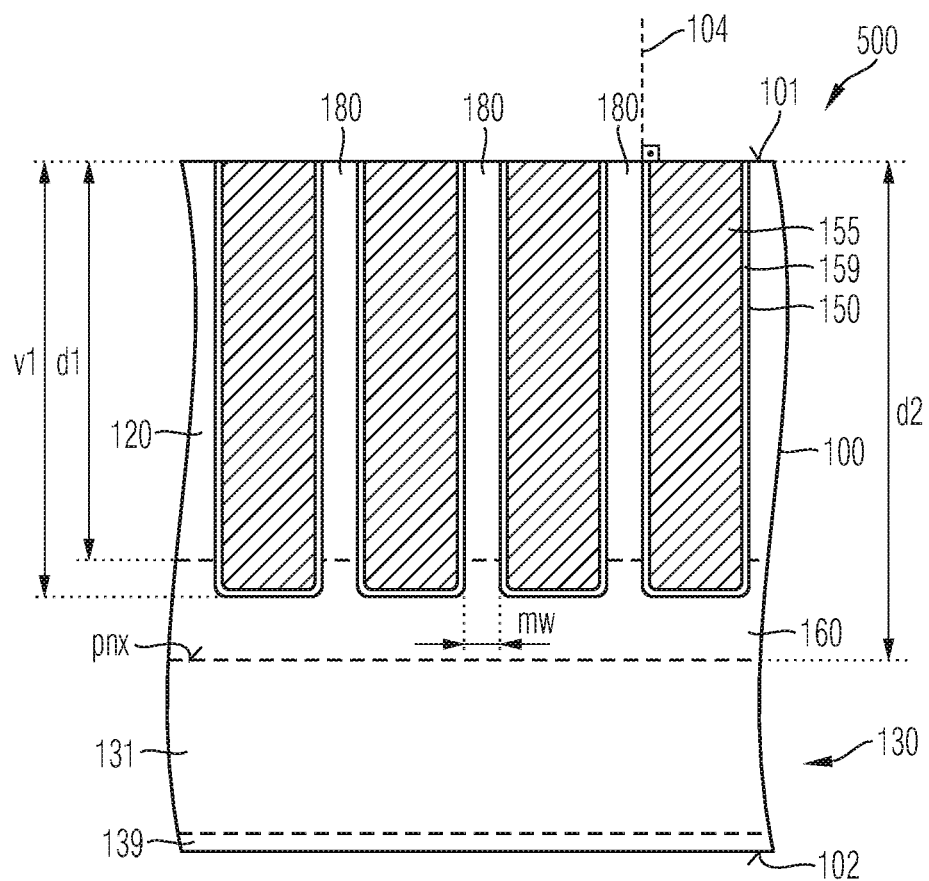
FIG. 1C is a schematic vertical cross-sectional view of the semiconductor device portion of FIG. 1A along line C-C.

FIGS. 1A to 1C show a vertical semiconductor device 500 with lateral field effect transistor cells TC. The term "vertical" stands for that a load current flows between two opposite main surfaces of a semiconductor die. The term "lateral" indicates that in the transistor cells the load current flow is directed along field effect-induced channels ("gated channels") parallel to the main surfaces.

The semiconductor device 500 may be or may include an IGFET (insulated gate field effect transistor), for example, an MOSFET (metal oxide semiconductor FET) in the usual meaning including FETs with metal gates as well as FETs with gates from a semiconductor material, an IGBT (insulated gate bipolar transistor) or an MCD (MOS controlled diode), by way of example.

The transistor cells TC are formed along a first surface 101 at a front side of a silicon carbide portion 100 based on, for example, 2H-SiC (SiC of the 2H polytype), 6H-SIC or 15R-SiC. According to an embodiment the semiconductor material may be silicon carbide of the 4H polytype (4H-SiC).

The first surface 101 may be tilted to a main crystal plane by an off-axis angle, which absolute value may be at least 2° and at most 12°, e.g., about 4°, wherein the first surface 101 may be planar or may include parallel first surface sections shifted to each other and tilted to a horizontal mean plane by the off-axis angle as well as second surface sections tilted to the first surface sections and connecting the first surface sections such that a cross-sectional line of the first surface 101 approximates a saw-tooth line. In the following, the term first surface 101 is to be understood as horizontal planar surface or as the mean plane of a serrated surface.

A normal 104 to a planar first surface 101 or to a mean plane of a serrated first surface 101 defines a vertical direction. Directions parallel to the planar first surface 101 or the mean plane of a serrated first surface 101 are horizontal directions and are also referred to as lateral directions in the following.

The silicon carbide portion 100 includes a drift structure 130 formed between the transistor cells TC and a second surface 102 of the silicon carbide portion 100 on a rear side, wherein the second surface 102 is parallel to the first surface 101. The first and second surfaces 101, 102 form the main surfaces of the silicon carbide portion 100. The drift structure 130 may include a heavily-doped base portion 139, which directly adjoins the second surface 102, and a lightly-doped drift zone 131 between the transistor cells TC and the heavily-doped base portion 139.

The drift structure 130 further includes a current spread region 132 between the first surface 101 and the drift zone 131, wherein the current spread region 132 has the same conductivity type as the drift zone 131. The current spread region 132 may directly adjoin the first surface 101 and may also directly adjoin the drift zone 131. A mean net dopant concentration in the current spread region 132 may be equal to or greater than a mean net dopant concentration in the drift zone 131.

According to an embodiment, the drift zone 131 and the current spread region 132 result from different epitaxy processes with different background doping. For example, the mean net dopant concentration in the current spread region 132 is at least two or at least five times the mean net dopant concentration in the drift zone 131. According to an embodiment the mean net dopant concentration in the drift zone 131 is at most $1e16$ $cm^{-3}$ and the mean net dopant concentration in the current spread region 132 is at least ten times the mean net dopant concentration in the drift zone 131. Channel regions 120, which may have the same conductivity type as the drift zone 131, the complementary conductivity type, or which may be intrinsic laterally separate the current spread region 132 from a source region 110, which may extend from the first surface 101 into the silicon carbide portion 100 and which has the conductivity type of the current spread region 132.

The channel regions 120 form first junctions j1 with the current spread region 132 and second junctions j2 with the source region 110. The first and second junctions j1, j2 may be pn junctions or unipolar junctions, e.g., junctions of the $n^-/n$-type or $p^-/p$-type and are tilted to the first surface 101. For example, the first and second junctions j1, j2 run approximately vertical to the first surface 101.

The channel regions 120 and the source region 110 are electrically connected with a source contact structure 315 directly or through a low-impedance path. The source contact structure 315 electrically connects the channel regions 120 and the source region 110 with a first load terminal L1. The first load terminal L1 may be the anode terminal of an MCD, the source terminal of an IGFET or the emitter terminal of an IGBT.

The drift structure 130 is electrically connected or coupled to a second load terminal L2, which may be the cathode terminal of an MCD, the drain terminal of an IGFET or the collector terminal of an IGBT.

A shielding region 160 of the conductivity type complementary to the conductivity type of the drift zone 131 is formed at a distance to the first surface 101 and separates the source region 110 and the channel regions 120 from the drift zone 131 along the vertical direction. The shielding region 160 and the drift zone 131 form an auxiliary pn junction pnx. The shielding region 160 may be electrically connected with the source contact structure 315 and may be part of low-resistive path between the channel regions 120 and the source contact structure 315. An area charge in the shielding region 160 may be in a range from $2e13$ $1/cm^2$ to $4e13$ $1/cm^2$, wherein a resulting net dopant concentration in the shielding region 160 may be in a range from $1e16$ $1/cm^3$ to $1e18$ $1/cm^3$, e.g., in a range from $5e16$ $1/cm^3$ to $5e17$ $1/cm^3$.

A connection portion 1311 of the drift zone 131 between neighboring shielding regions 160 vertically connects the current spread region 132 with the drift zone 131.

Trench gate structures 150 extend from the first surface 101 into the silicon carbide portion 100. The trench gate structures 150 may be arranged in gate rows extending along a first horizontal direction 191, wherein the trench gate structures 150 alternate sequentially with the channel regions 120 along the first horizontal direction 191.

A vertical extension v1 of the trench gate structures 150 may be equal to or greater than a first distance d1 between the shielding region 160 and the first surface 101 such that the trench gate structures 150 are in contact with the shielding region 160. The vertical extension v1 of the trench gate structures 150 is smaller than a second distance d2 between the auxiliary junction pnx1 and the first surface 101 such that at least a portion of the shielding region 160 is directly between the trench gate structures 150 and the drift zone 131. According to an embodiment, the vertical extension v1 may be in a range from 0.3 µm to 10 µm, e.g., from 0.5 µm to 5 µm or from 0.5 µm to 2 µm.

The trench gate structures 150 include a gate electrode 155 and a gate dielectric 159 that dielectrically insulates the gate electrode 155 from the silicon carbide portion 100. The gate electrode 155 may be electrically connected to a gate terminal G and may include heavily doped polycrystalline silicon, nickel, platinum and/or gold. According to an embodiment, the gate electrode is of or includes heavily p-doped polycrystalline silicon with a work function in a range from 5.0 eV to 5.5 eV, e.g. about 5.25 eV.

The gate dielectric 159 may completely insulate the gate electrode 155 from the silicon carbide portion 100. A thickness of the gate dielectric $d_{GD}$ may be in a range from 3 nm to 20 nm, e.g., from 3 nm to 10 nm. According to other embodiments, the trench gate structure 150 may include one or more separation dielectrics with a layer configuration and/or layer thickness different from the gate dielectric 159, wherein the one or more separation dielectrics may insulate the gate electrode 155 from at least one of the source region 110, the current spread region 132, and the shielding region 160.

A gate width wg of the trench gate structures 150 along the first horizontal direction 191 may be at most equal to a gate length lg along a second horizontal direction 192 orthogonal to the first horizontal direction, for example, at most lg/2.

Along the first horizontal direction 191 the trench gate structures 150 may be arranged at regular intervals, wherein a center-to-center distance p1 between neighboring trench gate structures 150 of the same row may be in a range from 100 nm to 5 µm, for example, from 1 µm to 5 µm. The gate length lg may be in a range from 200 nm to 10 µm, for example, in a range from 500 nm to 3 µm.

Along the second horizontal direction 192 the channel regions 120 may be shorter than the trench gate structures 150, approximately as long as the trench gate structures 150 or longer than the trench gate structures 150, wherein the first junction j1, the second junction j2 or both may be outside mesa sections 180 of the silicon carbide portion 100 between neighboring trench gate structures 150. Accordingly, the channel regions 120 may be completely or partially formed in mesa sections 180 of the silicon carbide portion 100 between neighboring trench gate structures 150.

Sidewalls of the mesa sections 180 may be at least approximately vertical to the first surface 101 or may be tilted to the normal 104 by a slope angle greater 0°. The mesa sidewalls may be parallel to each other or may taper with increasing distance to the first surface 101. The mesa sidewalls may be parallel to main crystal planes or may be tilted to all crystal planes. For example, both mesa sidewalls may be parallel to (−1100) and (1-100) crystal planes or parallel to (11-20) and (−1-120) crystal planes. According to another embodiment, one of the mesa sidewalls may be parallel to the (11-20) crystal plane and the other mesa sidewall may be tilted to the first mesa sidewall.

A mesa width mw of the mesa sections 180, a dopant concentration in the channel regions 120, and a material configuration of the trench gate structures 150 are selected such that for a first gate voltage within the absolute maximum rating of the semiconductor device 500 the channel regions 120 are completely depleted ("fully depleted") from mobile charge carriers and such that for a second, different gate voltage within the absolute maximum rating of the semiconductor device 500 the electric fields induced from opposite sides in the mesa sections 180 interact in a way that a bulk channel of charge carriers corresponding to the conductivity type of the source region 110 is formed at least in portions of the mesa sections 180.

Instead of two spatially separated inversion layers along the interfaces to the trench gate structures 150 as in comparatively wide mesas, one single bulk channel forms in each mesa section 180 at the second gate voltage, wherein the bulk channel includes charge carrier flow at least in a central portion of each mesa section 180.

In case of an n-type source region 110 and p-type channel regions 120, electrons form the bulk channel and the channel regions 120 may be completely in inversion ("volume-inverted"). Where in wide mesas two maxima of charge carrier density appear close to the two mesa sidewalls, in case of a bulk channel one single maximum of mobile charge carriers appears near the center of the mesa section 180.

A mesa section 180 is "completely in inversion" or "volume-inverted", if at least a portion of the mesa section 180 from one neighboring trench gate structure 150 to the other neighboring trench gate structure 150 is in inversion. The wording "completely in inversion" and "volume-inverted" may include that a top portion and/or a bottom portion of the mesa section 180 is not completely in inversion. A transistor cell TC exhibiting complete inversion in the sense defined above is of the volume-inversion type.

Electrons also form the bulk channel in case of n-type source region 110 and n-type channel regions 120. Formation of the bulk channels in the mesa sections 180 may start in the center of each mesa section 180.

Transistor cells with bulk channels provide significantly more minority charge carriers in the on-state of the semiconductor device 500. Providing, instead of two separated, comparatively thin inversion layers along the trench gate structures 150, the whole mesa cross-section for the charge carrier flow results in lower channel on-state resistance. Since a high portion of the minority charge carriers flows at a distance to the trench gate structures 150, interface states and surface-induced scattering effects along the gate dielectric 159 have only low adverse impact on the charge carrier flow in the mesa sections 180.

In the following the mode of operation of the semiconductor device 500 is discussed in more detail with reference to n-channel transistor cells TC with n-type source region 110 and n-type current spread region 132. The channel regions 120 may be intrinsic, lightly p-doped or lightly n-doped.

The gate voltage VGS is defined as the electric potential difference applied between the gate electrode 155 and the source region 110 by an external voltage source. The applied gate voltage VGS adds to a built-in voltage $V_{BI}$ resulting from different work functions of the trench gate structures 150 and the channel regions 120. Fixed charge carriers trapped at the interface of the gate dielectrics 159 may contribute to the built-in voltage $V_{BI}$. The built-in voltage $V_{BI}$ effects that in the absence of any externally applied gate voltage VGS, i.e., for VGS=0V, depletion zones laterally extend from the interfaces between the mesa sections 180 and the trench gate structures 150 into the intermediate channel regions 120.

According to an embodiment, mesa width mw, dopant concentration $N_{ch}$ in the channel regions 120, and material configuration of the trench gate structures 150 are selected such that for VGS=0V the depletion zones extending from opposite trench gate structures 150 into the intermediate mesa section 180 overlap and the channel regions 120 are completely depleted from mobile charge carriers.

With increasing gate voltage VGS, the electrostatic potential increases uniformly in the mesa section 180. At a gate voltage VGS greater than a threshold voltage Vth a bulk channel is formed. In case of p-type channel regions 120, volume-inversion may come into effect and minority charge carriers form gated channels with a lateral width equal to the mesa width mw. In case of n-type channel regions 120, formation of bulk channels may start in the center of the mesa sections 180. The threshold voltage Vth is given by, inter alia, the work functions of gate electrode 151 and channel region 120, and may be in a range from 0.5V to 6V, e.g., in a range from 1.5V to 5V or from 3V to 5V.

According to an embodiment, the silicon carbide portion 100 is one of 4H-SiC and 6H-SiC, the mesa width mw is at most 50 nm, e.g., at most 40 nm or below 30 nm and a net dopant concentration $N_{ch}$ in the channel region 120 is at most 1e17 1/cm$^3$, at most 1e16 1/cm$^3$, or at most 1e15 1/cm$^3$.

The current spread region 132 receives the lateral charge carrier flow controlled by the gated channels and diverts the charge carrier flow in the vertical direction such that the charge carriers vertically pass the drift zone 131 and reach the second surface 102 at the rear side of the silicon carbide portion 100.

The lateral arrangement of source region 110 with respect to the channel regions 120 facilitates the formation of a source contact outside the comparatively narrow mesa sections 180. The shielding region 160 effectively shields the trench gate structures 150 and the gate dielectric 159 against the potential applied at the base portion 139. The lateral channel between source region 110 and the current spread region 132 allows increasing the effective channel width per area just by increasing the vertical extension of the trench gate structures 150 without or with only low impact on other device parameters.

Equation (1) gives the width $W_{dep}$ of a depletion zone as a function of a surface potential $\Psi_S$ and a net channel dopant concentration $N_{ch}$:

$$W_{dep} = \sqrt{\frac{2\varepsilon_{SiC}\varepsilon_0\Psi_S}{eN_{ch}}} \quad (1)$$

In equation (1) $\varepsilon_{SiC}$ is the relative permittivity of the silicon carbide portion 100, e.g., $\varepsilon_{SiC}$ is 9.7, $\varepsilon_0$ is the vacuum permittivity (8.85×10$^{-12}$ As/Vm), and e is the elementary charge (1.6×10$^{-19}$ As). At inversion, the surface potential $\Psi_s$ becomes equal to twice the bulk potential $\Psi_b$.

$$\Psi_S = 2\Psi_b = 2\frac{kT}{e}\ln\left(\frac{N_{ch}}{n_i}\right) \quad (2)$$

In equation (2) k is the Boltzmann constant (1.38066×10$^{-23}$ J/K), T is the thermodynamic temperature (e.g. 300 K), ln is the natural logarithm and $n_i$ is the intrinsic carrier concentration at the thermodynamic temperature T. The intrinsic carrier density $n_i$ of SiC is about 1e-07 1/cm$^3$ in 4H-SiC and about 1e-05 1/cm$^3$ in 6H-SiC. Equation (3) combines equations (1) and (2) and gives the width $W_{dep}$ of the depletion zone at $V_{GS}=0$.

$$W_{dep} = \sqrt{\frac{4\varepsilon_{SiC}\varepsilon_0 kT \ln(N_{ch}/n_i)}{e^2 N_{ch}}} \quad (3)$$

Equation (3) gives the depletion width $W_{dep}$ and inherently the upper limit for the mesa width mw as a function of material characteristics, temperature and of the net channel dopant concentration $N_{ch}$ in the channel region 120, e.g. in case of a p-type channel region, an n-type channel region 120 or an intrinsic channel region 120.

Table 1 below gives maximum values for the mesa width mw for three different channel dopant concentrations $N_{ch1}$, $N_{ch2}$ and $N_{ch3}$, with $N_{ch1}$=1e15 1/cm$^3$, $N_{ch2}$=1e16 1/cm$^3$ and $N_{ch3}$=1e17 1/cm$^3$ for 4H-SiC and 6H-SiC and a p-type channel region 120.

TABLE 1

|  | $N_{ch1}$ | $N_{ch2}$ | $N_{ch3}$ |
| --- | --- | --- | --- |
| 4H—SiC | 1677.59 nm | 542.42 nm | 175.22 nm |
| 6H—SiC | 1596.21 nm | 517.23 nm | 167.41 nm |

For a given mesa width mw and for a given channel net dopant concentration Nch, the bulk potential and voltage drop across the gate dielectric 159 are selected to achieve a threshold voltage Vth in a range from 2.5 V to 6 V, wherein the threshold voltage Vth is given by equation (4).

$$V_{th} = V_{fb} + 2\Psi_b + \frac{\sqrt{2\varepsilon_{SiC}\varepsilon_0 eN_{ch}(2\Psi_b)}}{C_{GD}} \quad (4)$$

In equation (4) $V_{fb}$ is the flat-band voltage given by the difference in work function between gate electrode 155 and channel region 120 and $C_{GD}$ is the capacitance of the gate dielectric 159. Table 2 below gives the bulk potential $\Psi_b$ in Volt for the dopant levels $N_{ch1}$, $N_{ch2}$ and $N_{ch3}$ in 4H-SiC and 6H-SiC.

TABLE 2

|  | $N_{ch1}$ | $N_{ch2}$ | $N_{ch3}$ |
| --- | --- | --- | --- |
| 4H—SiC | 2.62 | 2.74 | 2.86 |
| 6H—SiC | 2.38 | 2.50 | 2.62 |

For example, a gate electrode 155 from p-type polycrystalline silicon may exhibit a work function of 5.25 eV. The work function for n-type 4H-SiC may be 3.4 eV. The resulting flat-band voltage $V_{fb}$ is about 1.85 V. According to equation (4) a flat-band voltage $V_{fb}$ of 1.85 V results in a threshold voltage $V_{th}$ of about 4 V.

Figures 2A, 2B:
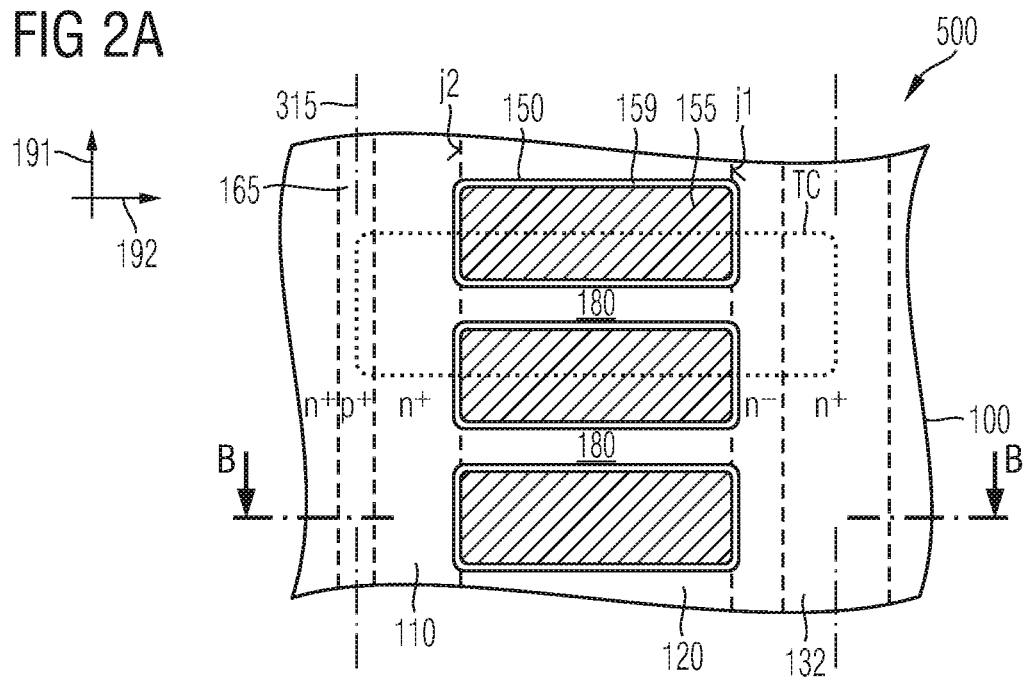
FIG. 2A is a schematic horizontal cross-sectional view of a portion of a semiconductor device according to an embodiment combining a planar source contact and a heavily-doped channel contact region with trench gate structures spaced apart from, i.e. disposed in a distance to, a current spread region.
FIG. 2B is a schematic vertical cross-sectional view of the semiconductor device portion of FIG. 2A along line B-B.

In FIGS. 2A and 2B a planar source contact structure 315 formed on the first surface 101 forms a low-resistive contact, for example, an ohmic contact with the source region 110. The source contact structure 315 may be electrically connected to a first load electrode, that may form or that may be electrically connected to a source terminal S.

A heavily-doped channel contact region 165 may form part of a low resistive connection between the source contact structure 315 and the channel regions 120. For example, the channel contact region 165 may directly adjoin the shielding region 160 and the shielding region 160 may be in direct contact with the channel regions 120.

A second load electrode 320 may directly adjoin the second surface 102 and the base portion 139. The second load electrode 320 may form or may be electrically connected to a drain terminal D.

The current spread region 132 may include a heavily-doped portion 1322 and a lightly-doped portion 1321, wherein the heavily-doped portion 1322 directly adjoins the connection portion 1311 of the drift zone 131 and wherein the lightly-doped portion 1321 laterally separates the heavily-doped portion 1322 from the channel regions 120 along the second horizontal direction 192.

Splitting up the current spread region 132 in portions of different dopant concentration gives a further degree of freedom for adjusting a trade-off concerning the portion of the on-state resistance resulting from the connection of the gated channels to the current spread region and the voltage blocking capability.

A plurality of transistor cells TC connected to the same source contact structure 315 are arranged in a first transistor row extending parallel to the first horizontal direction 191. A second transistor row of transistor cells TC may be formed mirror-inverted to the first transistor row with respect to a vertical center plane of the channel contact region 165 parallel to the first horizontal direction 191. A plurality of pairs of first and second transistor rows may be formed next to each other, wherein the first transistor row of a first pair of transistor rows and the second transistor row of a second pair of transistor rows may share the same current spread region 132.

Figure 3A:
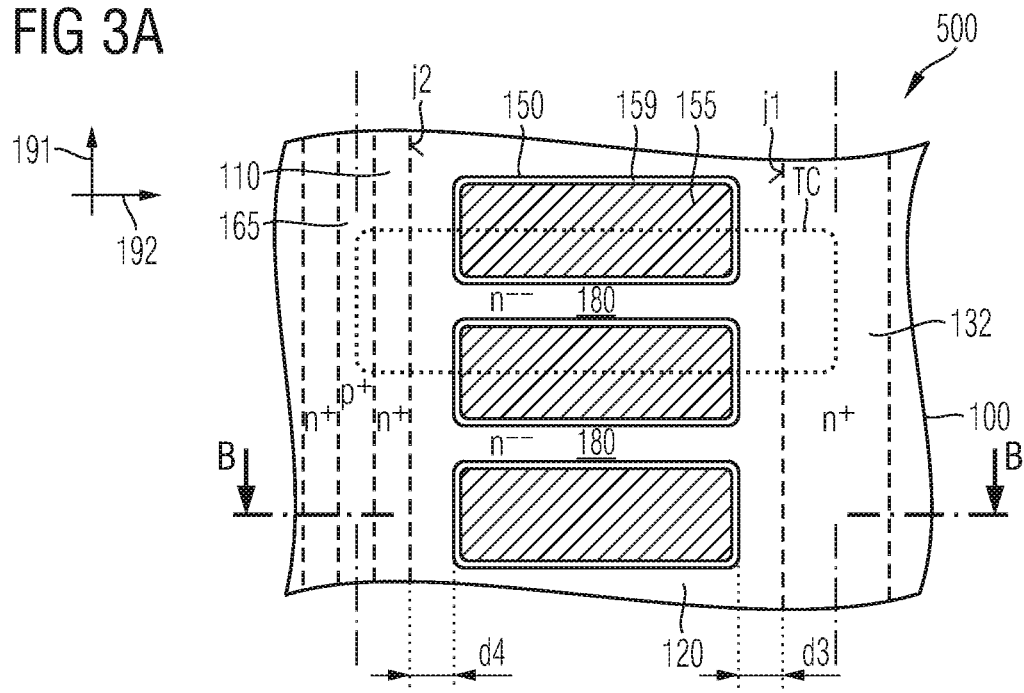
FIG. 3A is a schematic horizontal cross-sectional view of a portion of a semiconductor device according to an embodiment combining planar source contacts and a heavily-doped channel contact region with trench gate structures spaced from a source region and from a current spread region.
Figure 3B:
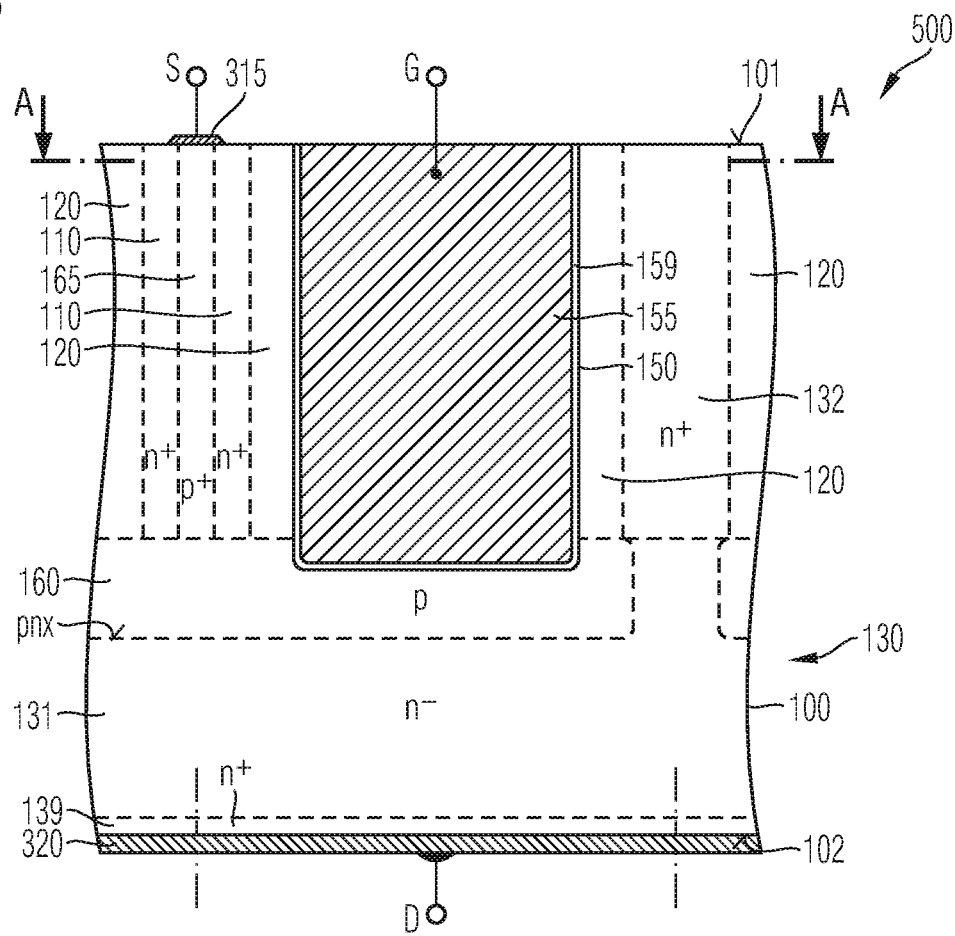
FIG. 3B is a schematic vertical cross-sectional view of the semiconductor device portion of FIG. 3A along line B-B.

In the semiconductor device 500 of FIGS. 3A to 3B the channel regions 120 have the same conductivity type as the source regions 110 and the current spread region 132. The channel regions 120 extend both on the source side and on the current spread side beyond the trench gate structures 150.

In the following, along the second horizontal direction 192 the location of a pn junction is defined by a net dopant concentration equal to zero and the location of a unipolar junction, e.g., $n^-/n$ junction or $p^-/p$ junction, is defined by a turning point of the net dopant profile along the second horizontal direction 192.

A first lateral distance d3 between the first junction j1 and the trench gate structures 150 may be in a range from 0.2 μm to 3 μm, for example in a range from 0.5 μm to 2 μm. A second lateral distance d4 between the trench gate structures 150 and the second junction j2 may be in a range from 0.2 μm to 2 μm, for example in a range from 0.5 μm to 1.5 μm.

In FIGS. 4A to 5C the channel regions 120 are shorter than the trench gate structures 150 along the second horizontal direction 192 and both the first junctions j1 and the second junctions j2 are formed in the mesa sections 180 between neighboring trench gate structures 150.

Figure 4A:
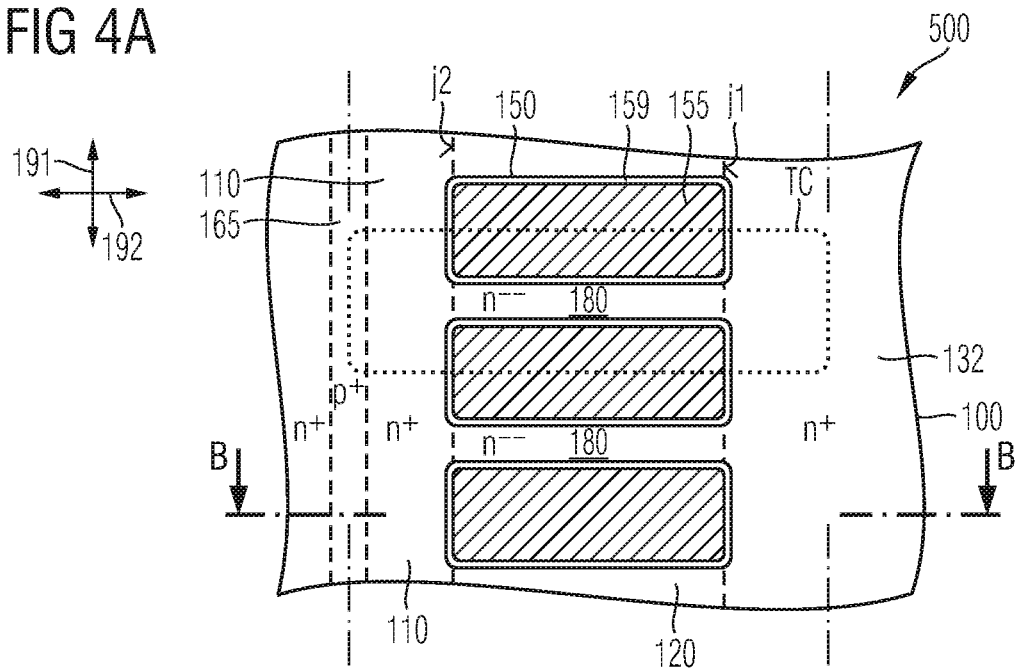
FIG. 4A is a schematic horizontal cross-sectional view of a portion of a semiconductor device according to an embodiment related to channel regions of the conductivity type of the source regions.
Figure 4B:
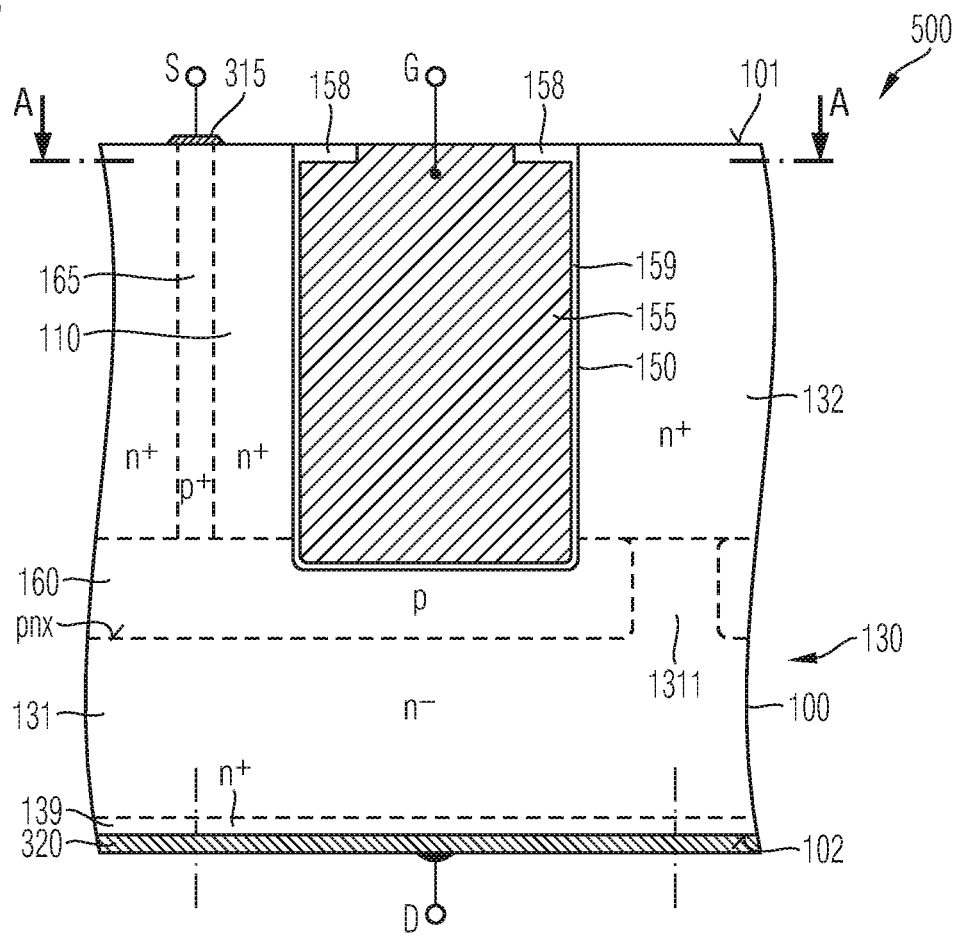
FIG. 4B is a schematic vertical cross-sectional view of the semiconductor device portion of FIG. 4A along line B-B.

In FIGS. 4A and 4B the channel regions 120 have the same conductivity type as the source region 110 and the current spread region 132. The first and second junctions j1, j2 are n–/n type junctions.

Figure 5A:
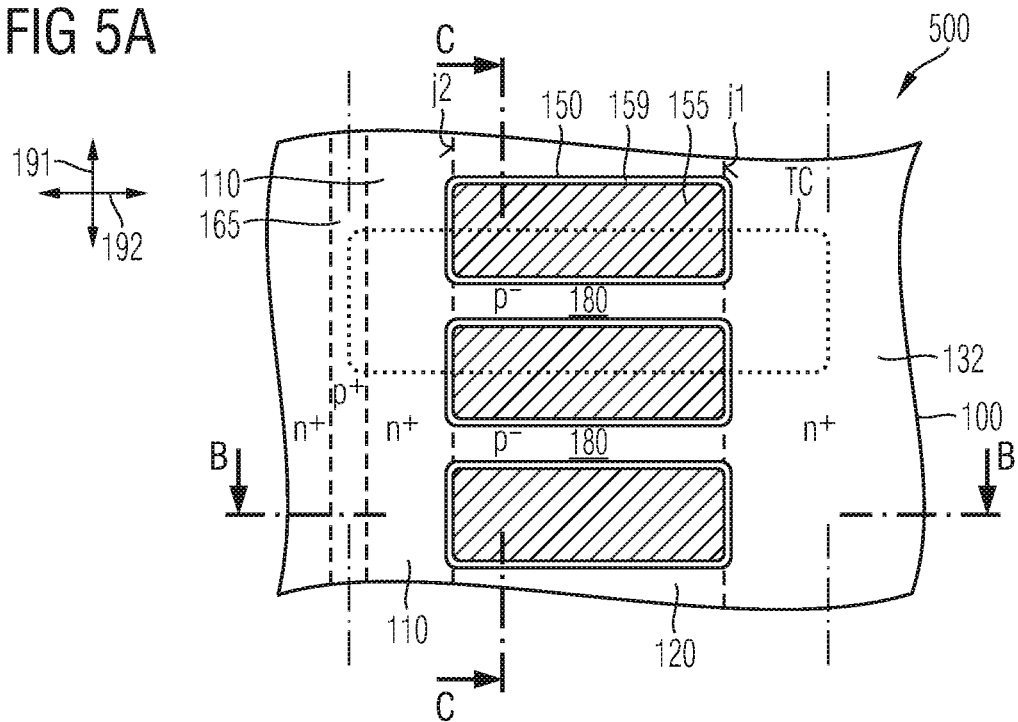
FIG. 5A is a schematic horizontal cross-sectional view of a portion of a semiconductor device according to an embodiment related to channel regions forming pn junctions with the source regions.
Figure 5B:
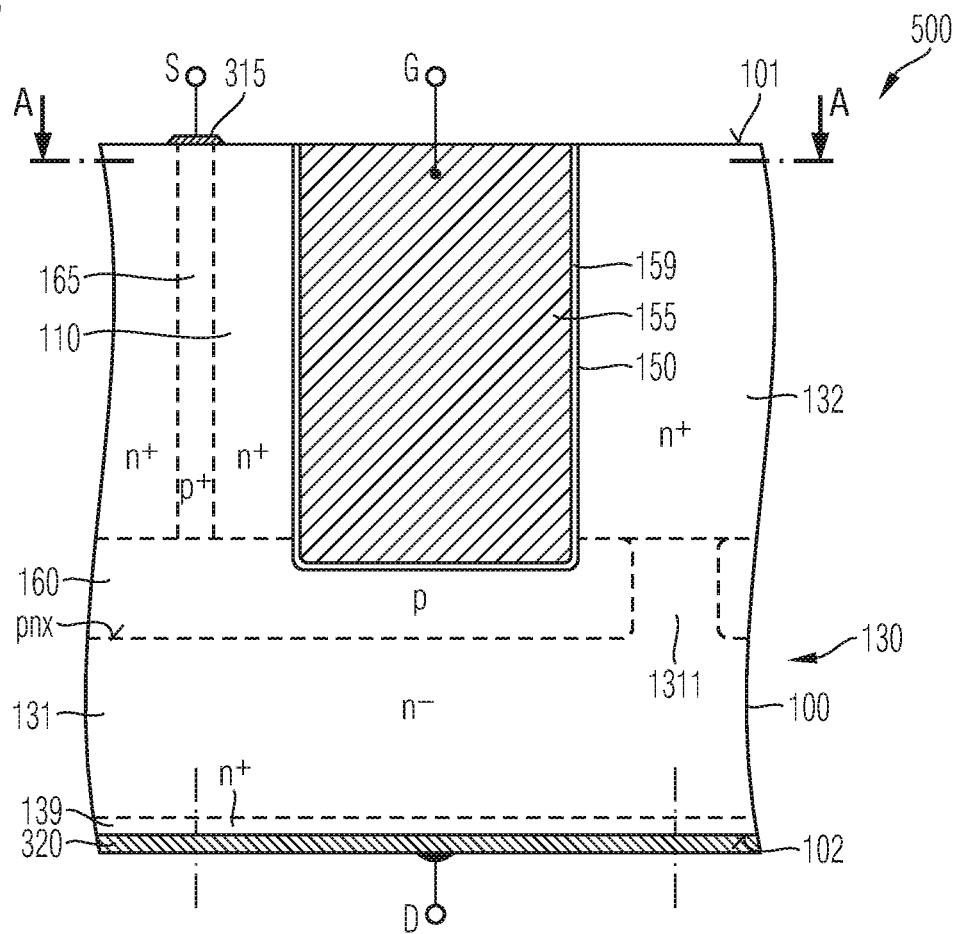
FIG. 5B is a schematic vertical cross-sectional view of the semiconductor device portion of FIG. 5A along line B-B.

In FIG. 4B the trench gate structures 150 include dielectric spacers 158 at least at one of the source side and the drain side. The dielectric spacers 158 may suppress inversion induced by a gate connection line running above the mesa sections 180 to prevent local inversion at a gate voltage below Vth. In FIGS. 5A to 5C the channel regions 120 in the mesa sections 180 are p-type and the first and second junctions j1, j2 are pn junctions. FIG. 5C further shows p-type blocking regions 188 at the top of the mesa sections 180 between the first surface 101 and the channel regions 120. A net dopant concentration in the blocking regions 188 is higher than in the channel regions 120 such that the blocking regions 188 sufficiently decouple the mesa sections 180 from a gate connection line running above the mesa sections 180 to prevent local inversion at gate voltages below Vth.

According to an embodiment related to n-type channel regions 120 forming n–/n type junctions j1, j2, the p-type blocking regions 188 form pn junctions with the channel regions 120. According to another embodiment, a local material modification or thickness variation of the gate dielectric 159 may suppress local inversion.

The semiconductor device 500 illustrated in FIGS. 6A and 6B includes a deep source contact structure 315 that extends from the first surface 101 down to or into the shielding region 160. The source contact structure 315 may include a conductive liner 316 containing a first conductive material and a fill portion 318 containing a second, different conductive material, wherein the conductive liner 316 directly adjoins the silicon carbide portion 100 and separates the fill portion 318 from the silicon carbide portion 100.

The first conductive material may include a metal. For example the first conductive material is a metal silicide, e.g. a nickel silicide phase. The second conductive material may be heavily-doped polycrystalline silicon.

Figure 7A:
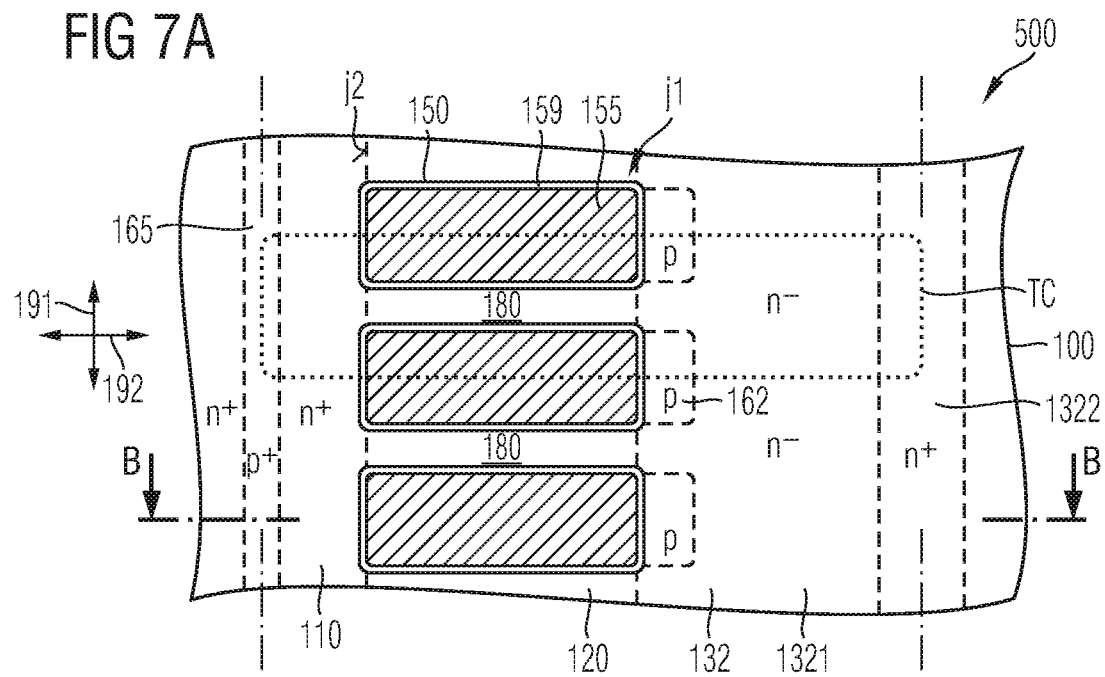
FIG. 7A is a schematic vertical cross-sectional view of a portion of a semiconductor device according to an embodiment related to lateral shielding regions between the trench gate structures and the current spread region.
Figure 7B:
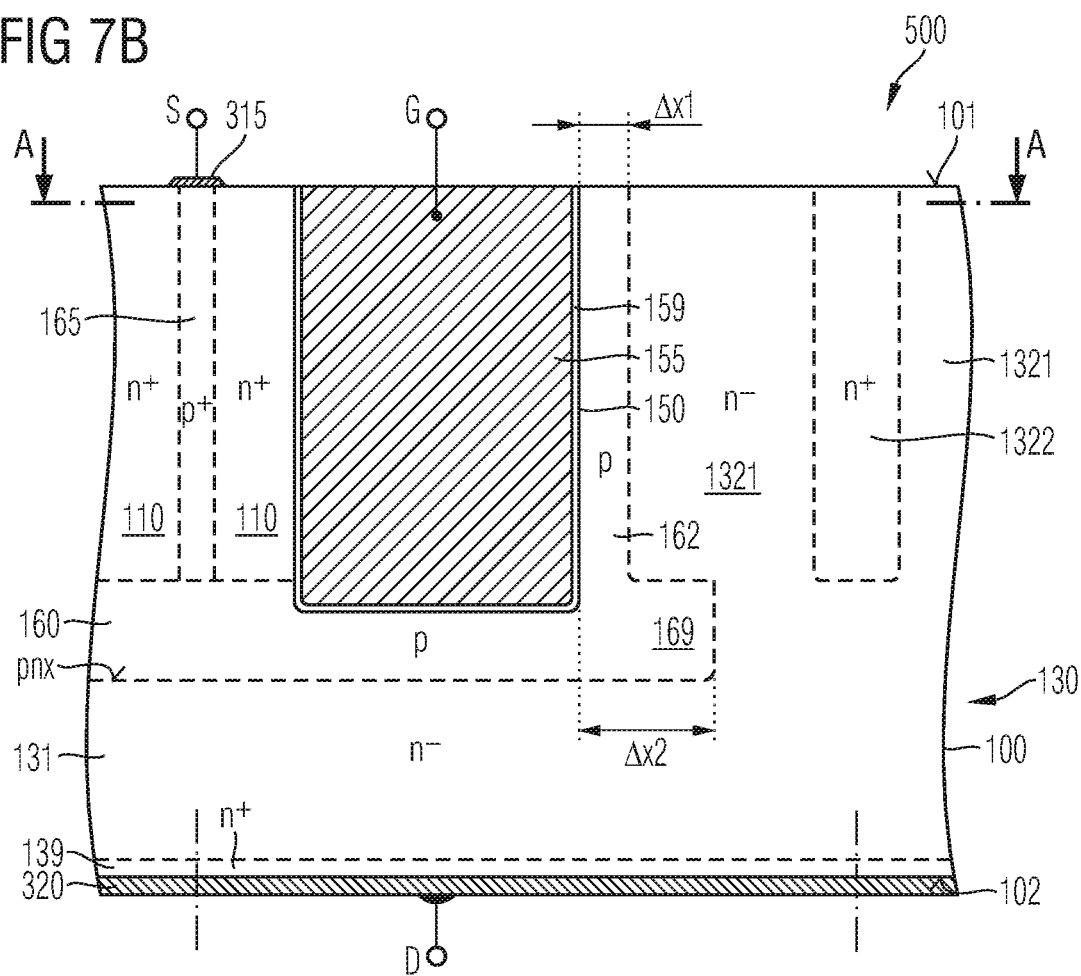
FIG. 7B is a schematic vertical cross-sectional view of the semiconductor device portion of FIG. 7A along line B-B.

FIGS. 7A and 7B show lateral shielding portions 162 of the same conductivity type as the shielding region 160. The lateral shielding portions 162 directly adjoin the trench gate structures 150 at a side oriented to the current spread region 132 and laterally shield the trench gate structures 150 with the gate dielectric 159 against the potential of the current spread region 132.

The lateral shielding portions 162 may have a dopant concentration within the same order of magnitude as the mean net dopant concentration in the shielding region 160. The lateral shielding portions 162 may directly adjoin the shielding region 160.

The lateral shielding portions 162 may be combined with a current spread region 132 including a heavily-doped portion 1322 and a lightly-doped portion 1321 between the trench gate structures 150 and the heavily-doped portion 1322. A first lateral extension Δx1 of the lateral shielding portions 162 along the second horizontal direction 192 may be smaller than a lateral distance between the heavily-doped portion 1322 of the current spread region 132 and the trench gate structures 150. The first lateral extension Δx1 may be in a range from 0.2 μm to 2 μm, for example in a range from 0.5 μm to 1 μm.

Alternatively or in addition to the lateral shielding portions 162, the shielding region 160 may include an extension portion 169 extending by a second lateral extension Δx2 beyond the trench gate structure 150 along the second horizontal direction 192. The second lateral extension Δx2 may exceed the first lateral extension Δx1 by at least 0.5 μm, for example, by at least 1 μm.

The extension portion 169 effectively protects the trench gate structure 150 and the gate dielectric 159 against the high electric fields occurring in and close to the connection portion 1311. The extension portions 169 and the connection portions 1311 of the drift zone 131 form an intrinsic JFET (junction field effect transistor) structure.

FIGS. 8A to 8F illustrate termination structures of semiconductor devices 500 with transistor cells TC as described in detail with reference to the previous figures. The semiconductor devices 500 are illustrated with deep source contact structures 315 and short channel regions 120 laterally not extending beyond the trench gate structures 150 for simplicity. Other embodiments may combine any of the termination structures illustrated in FIGS. 8A to 8D with other types of transistor cells TC as described above.

The semiconductor devices 500 illustrated in FIGS. 8A to 8D include a central area 610, which includes the transistor cells TC, and an edge area 690 between an lateral outer surface 103 of the silicon carbide portion 100 and the central area 610, wherein the edge area 690 surrounds the central area 610 and is devoid of functional transistor cells. The edge area 690 may include an outer edge region 699 directly along the outer surface 103 and an inner edge region 691 between the outer edge region 699 and the central area 610. In the inner edge region 691 a thickness of the silicon carbide portion 100 may decrease by a step height Δv from a central vertical extension v2 of the central area 610 to an outer vertical extension v3 of the outer edge region 699, wherein a second surface 102 on the back of the silicon carbide portion 100 is planar and the first surface 101 at the front side includes two parallel surface sections 1011, 1013 and a tilted surface section 1012 connecting the two parallel surface sections 1011, 1013.

The step height Δv may be in a range from a first distance d1 between the shielding region 160 and the first surface 101 to a second distance d2 between the auxiliary junction pnx1 and the first surface 101, see FIG. 1C. The outer vertical extension v3 is a function of the voltage blocking capability and may be in a range from 3 μm to 100 μm, for example in a range from 4.5 μm to 15 μm. For example, the outer vertical extension v3 may be about 4.5 μm for a voltage blocking capability of 600V and about 60 μm for a voltage blocking capability of 6.5 kV. An edge width Δw of the outer edge region 699 may be in a range from 8*v3 to 10*v3, by way of example.

A difference Δv between the central vertical extension v2 and the outer vertical extension v3 may be equal to or greater than a vertical extension of the source regions 110 in the central area 610 such that in the outer edge region 699 the drift zone 131 may directly adjoin the first surface 101, wherein such that the electric potential applied to the rear side appears at the outermost edge of the front side. In this case the full blocking voltage is accommodated along the front side between the lateral outer surface 103 and the central area 610, whereas the outer surface 103 is free of electric fields.

The base portion 139 may reach the outer surface 103 and a second load electrode 320 may directly adjoin the second surface 102 in the central area 610 and the edge area 690.

The edge area 690 may include a junction termination extension 170 that directly adjoins the shielding region 160. A vertical extension of the junction termination extension 170 may be approximately equal to the vertical extension of the shielding region 160. In the outer edge region 699 a portion of the junction termination extension 170 may directly adjoin the first surface 101. In the inner edge region 691 a doped region 181 of the conductivity type of the source region 110 and with a dopant concentration within the same order of magnitude as the dopant concentration in the source region 110 may separate the junction termination extension 170 from the tilted surface section 1012.

Figure 8A:
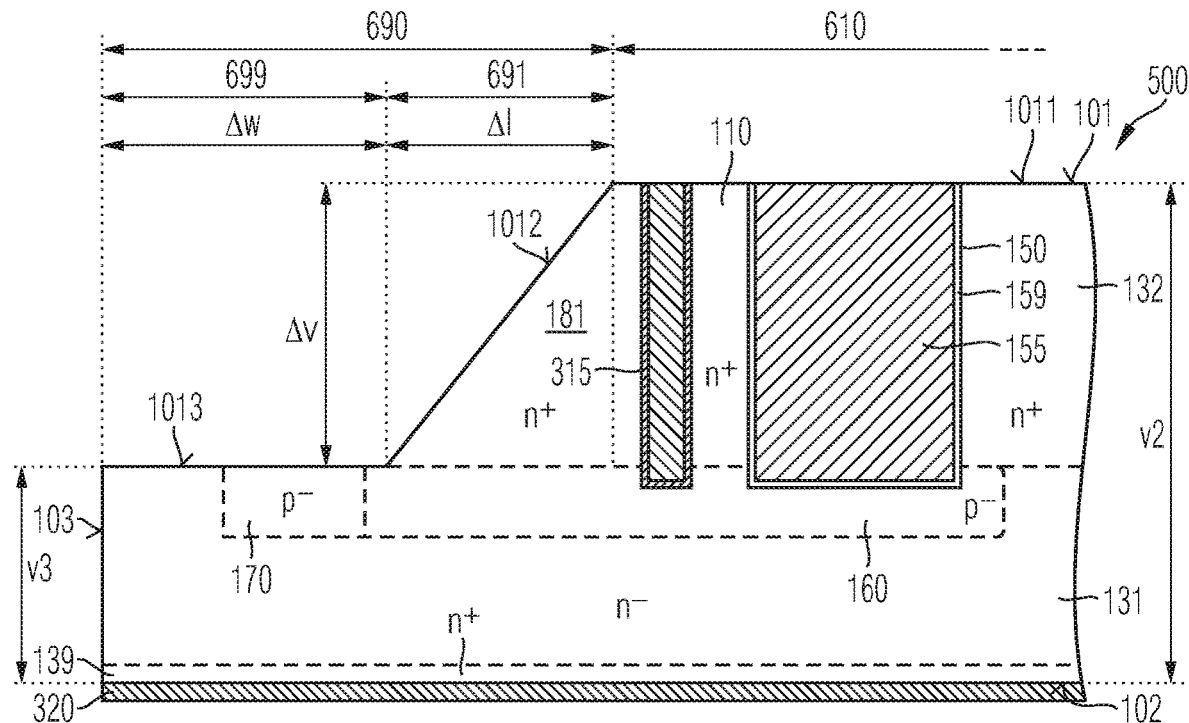
FIG. 8A is a schematic vertical cross-sectional view of a termination portion of a semiconductor device according to an embodiment related to homogeneously doped junction termination extensions.

In FIG. 8A the junction termination extension 170 is a homogeneously doped region with a dopant concentration of at most half, e.g., at most 10% of the net dopant concentration in the shielding region 160.

Figure 8B:
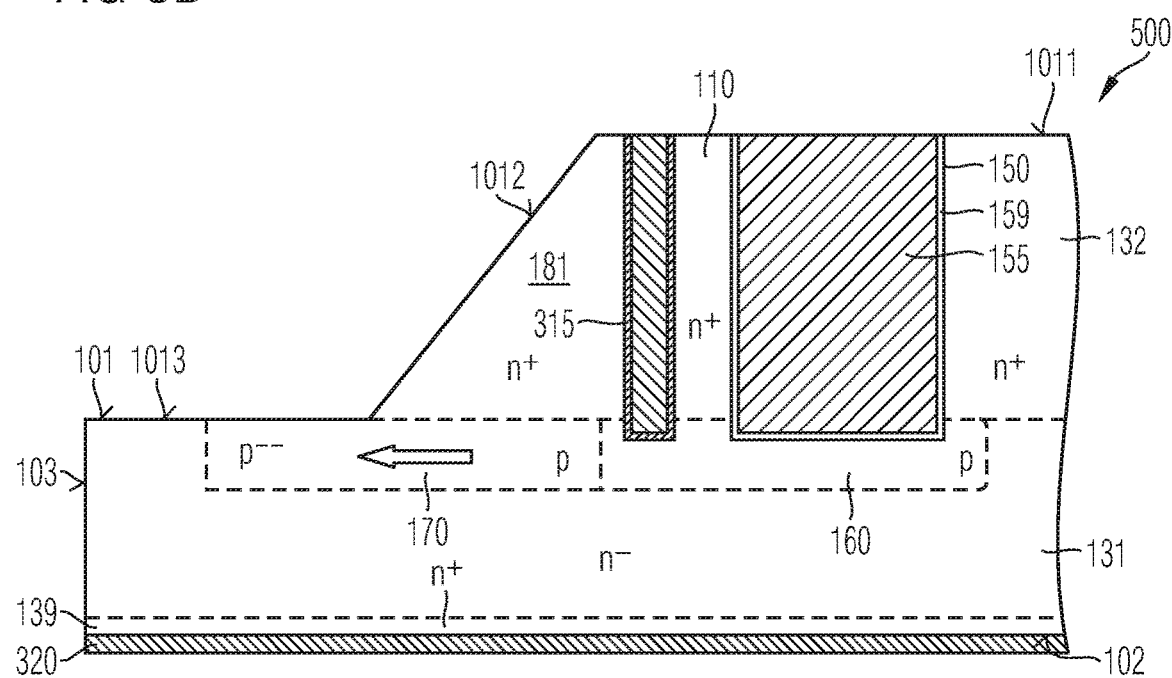
FIG. 8B is a schematic vertical cross-sectional view of a termination portion of a semiconductor device according to an embodiment related to junction termination extensions with a net dopant concentration decreasing with decreasing distance to an outer surface.

In FIG. 8B the dopant concentration in the junction termination extension 170 gradually decreases with increasing distance to the shielding region 160.

Figure 8C:
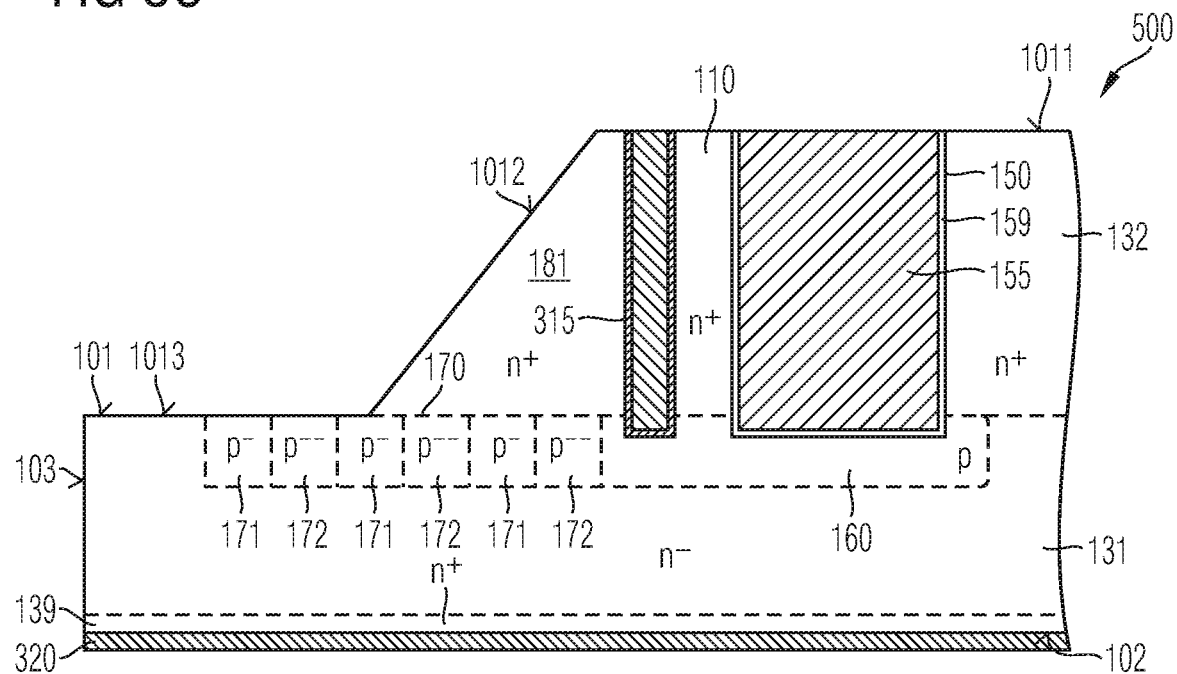
FIG. 8C is a schematic vertical cross-sectional view of a termination portion of a semiconductor device according to an embodiment related to junction termination extensions including lightly-doped zones.
Figure 8D:
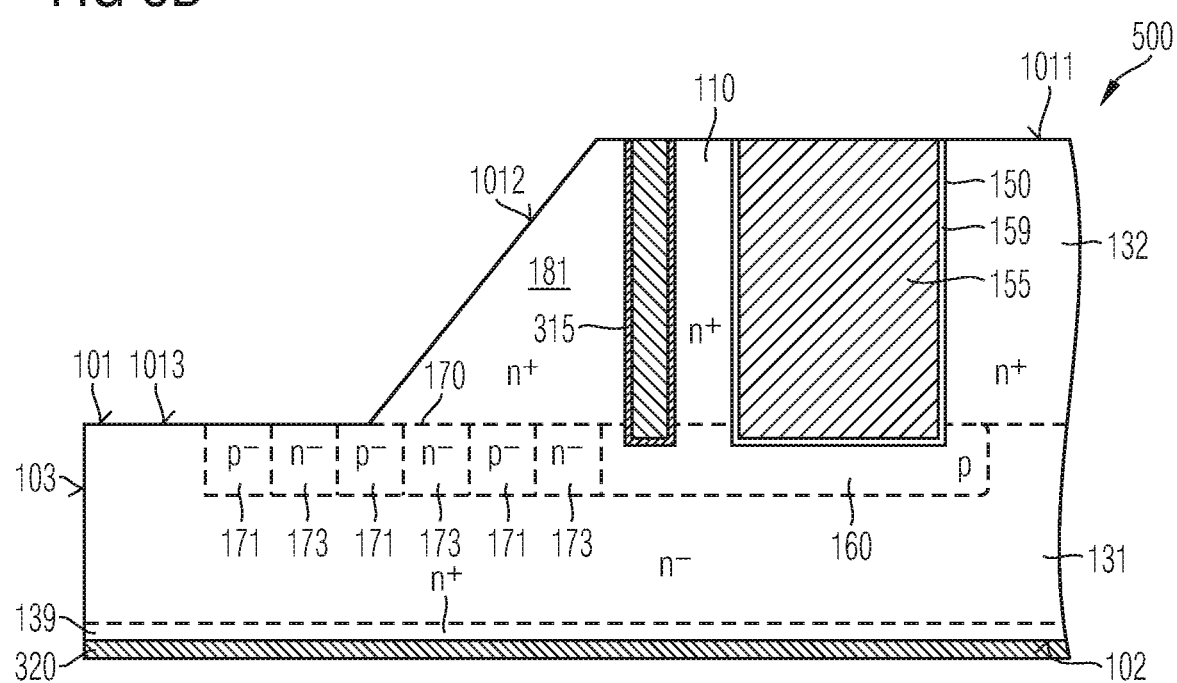
FIG. 8D is a schematic vertical cross-sectional view of a termination portion of a semiconductor device according to an embodiment related to junction termination extensions including counter-doped zones.

In FIGS. 8C and 8D the junction termination extension 170 includes two or more uniformly doped first zones 171 with a mean dopant concentration lower than in the shielding region 160, wherein each of the first zones 171 may surround the central area 610.

In FIG. 8C the first zones 171 laterally alternate with lightly-doped second zones 172 of the same conductivity type as the first zones 171, wherein a mean dopant concentration in the second zones 172 is at most 50%, e.g., at most 10% of the mean dopant concentration in the first zones 171.

In FIG. 8D the first zones 171 laterally alternate with ring-shaped counter-doped zones 173.

Figure 8E:
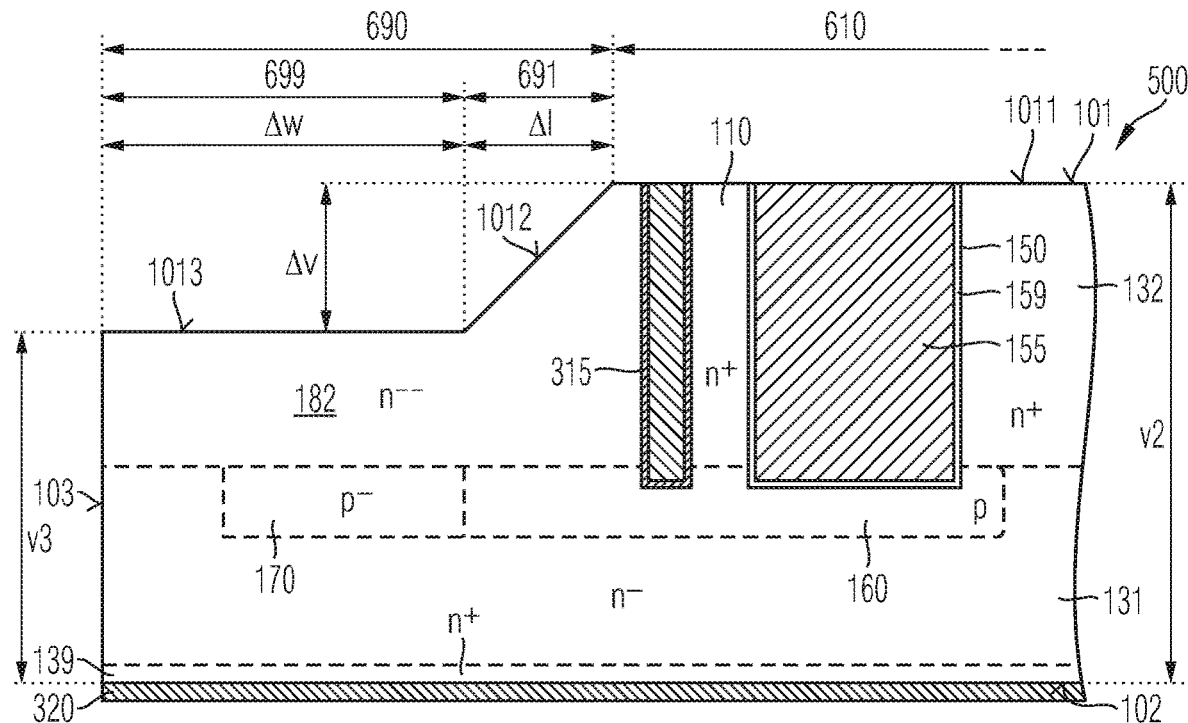
FIG. 8E is a schematic vertical cross-sectional view of a termination portion of a semiconductor device according to an embodiment related to shallowly-recessed edge areas.

In FIG. 8E the first surface 101 is planar and the edge area 690 is unrecessed.

Figure 8F:
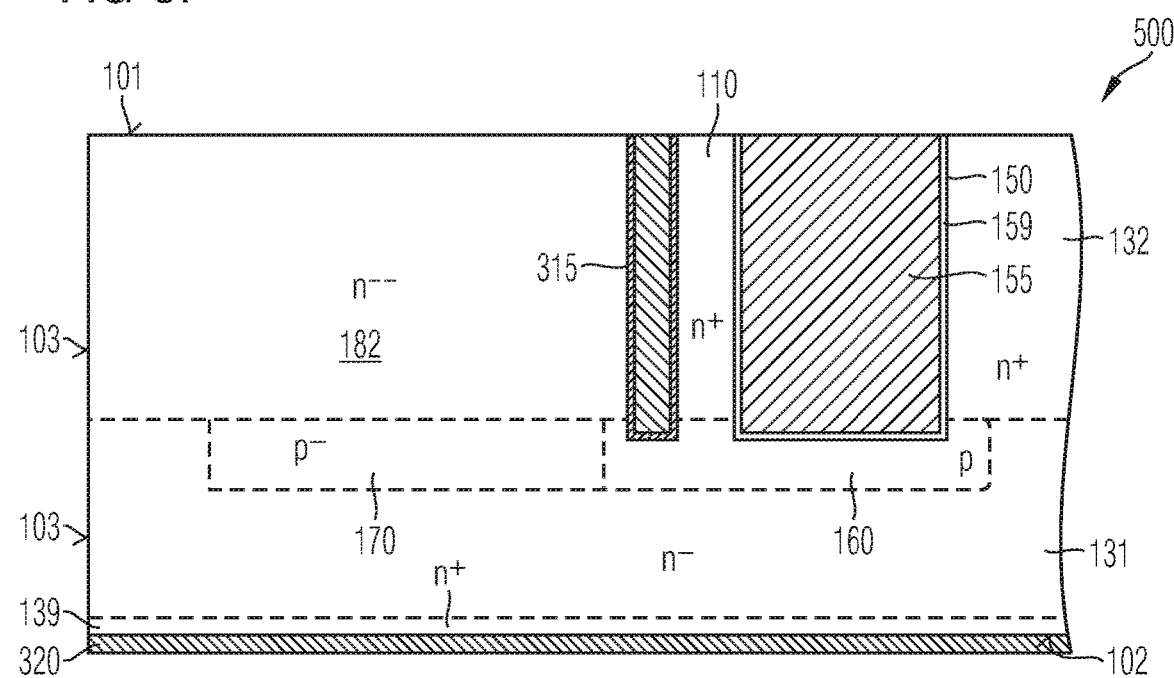
FIG. 8F is a schematic vertical cross-sectional view of a termination portion of a semiconductor device according to an embodiment related to non-recessed edge areas.

FIG. 8F refers to an edge area 690 with a lightly-doped edge region 182 between the first surface 101 and the junction termination extension 170. Dopant type and dopant concentration of the lightly-doped edge region 182 may be equal to dopant type and dopant concentration in the channel regions. The difference Δv between the central vertical extension v2 and the outer vertical extension v3 is significantly smaller than a vertical extension of the source regions 110.

Figure 9:
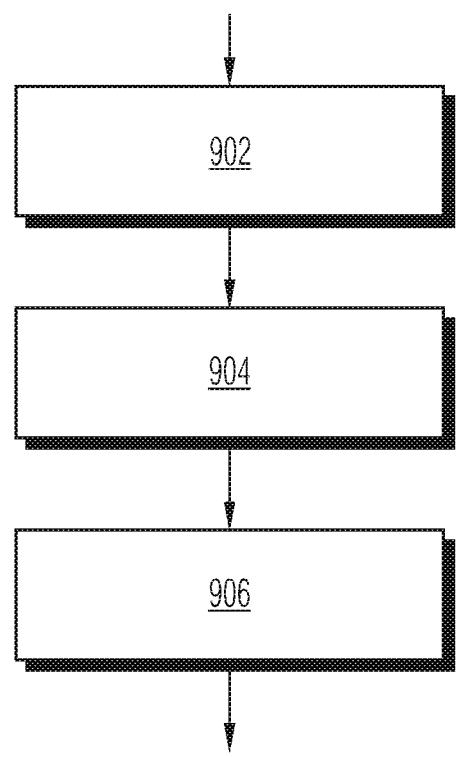
FIG. 9 is a simplified flowchart of a method of manufacturing semiconductor devices according to a further embodiment.

FIG. 9 refers to a method of manufacturing semiconductor devices. A shielding region is formed in a silicon carbide substrate (902), wherein the shielding region forms an auxiliary pn junction with a drift zone. A source region and a current spread region are formed in a portion of the silicon carbide substrate between a main surface of the silicon carbide substrate and the shielding region (904). Longitudinal axes of the source region and the current spread region run parallel to a first horizontal direction. Trench gate structures are formed between the source region and the current spread region (906). The trench gate structures extend from the main surface into the silicon carbide substrate, wherein the trench gate structures and mesa sections of the silicon carbide substrate sequentially alternate along the first horizontal direction. A mesa width of the mesa sections along the first horizontal direction is at most 100 nm and a net dopant concentration in the mesa sections 180 is calculated as described with reference to FIGS. 1A to 1C.

The process allows cost effective manufacturing of vertical semiconductor devices with lateral gated channels with low channel resistance in semiconductor materials with high dielectric breakdown strength, for example in silicon carbide.

FIGS. 10 to 19B illustrate an embodiment of the method of FIG. 9 in more detail. A first epitaxial layer 780 may be formed by epitaxy on a process surface 771 of a heavily-doped base substrate 770.

Figure 10:
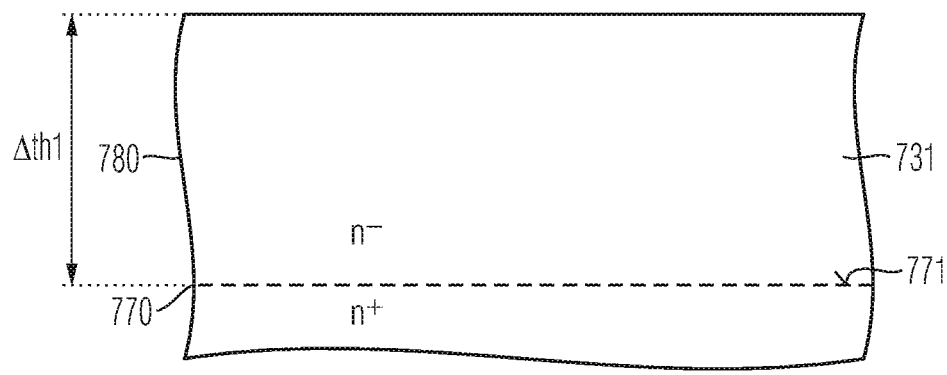
FIG. 10 is a schematic vertical cross-sectional view of a portion of a silicon carbide substrate for illustrating a method of manufacturing vertical semiconductor devices with fully depleted channel regions, after forming a first epitaxial layer.

FIG. 10 shows the first epitaxial layer 780 on the base substrate 770, which may be a silicon carbide slice obtained from a silicon carbide ingot by sawing, by way of example. The base substrate 770 may be n-type 2H-SiC, 4H-SiC, 6H-SiC or 15R-SiC. The resistivity of the base substrate 770 may be lower than the resistivity of the first epitaxial layer 780, for example, at most 10% of a mean resistivity in the first epitaxial layer 780. The first epitaxial layer 780 includes a main portion and may include a comparatively heavily doped field stop layer with a thickness from 0.5 μm to 10 μm and a maximum dopant concentration in a range from 1e17 cm$^{-3}$ to 1e19 cm$^{-3}$ between the main portion and the base substrate 770. The first epitaxial layer 780 may have the same conductivity type as the base substrate 770, wherein a background doping of the main portion corresponds to the dopant concentration and conductivity type of a drift layer 731 defining drift zones in the finalized semiconductor devices. A first layer thickness th1 of the first epitaxial layer 780 is a function of the target voltage blocking capability and may in a range from 3 μm to 100 μm.

Dopants corresponding to a conductivity type opposite to the conductivity type of the drift layer 731 may be implanted through an exposed first epitaxial surface 781 of the first epitaxial layer 780.

Figure 11A:
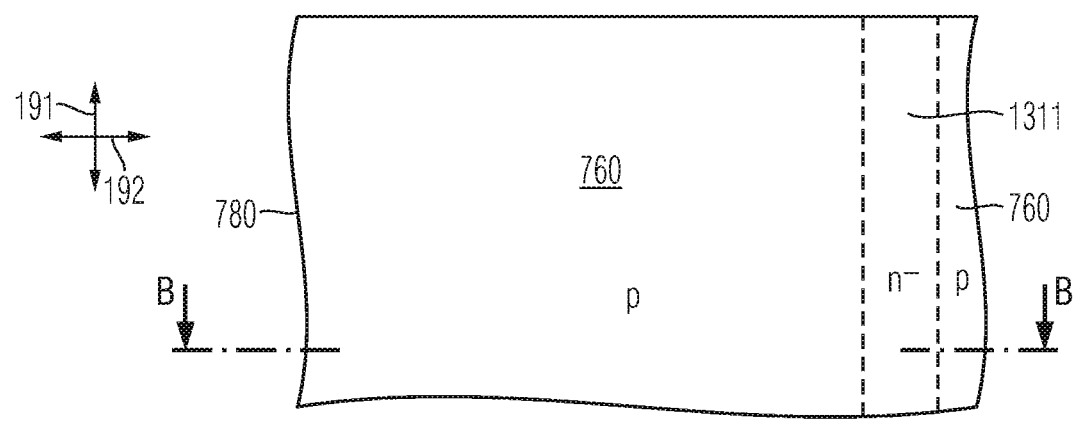
FIG. 11A is a schematic plan view of the silicon carbide substrate portion of FIG. 10 after forming shielding implants.
Figure 11B:
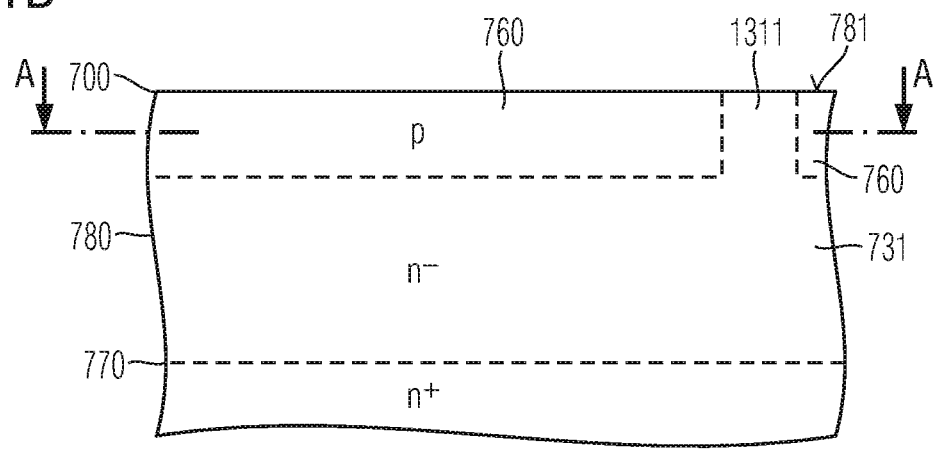
FIG. 11B is a schematic vertical cross-sectional view of the silicon carbide substrate portion of FIG. 11A along line B-B.

FIG. 11A shows the implanted dopants forming shielding implants 760 that form stripes with longitudinal axes parallel to a first horizontal direction 191. FIG. 11B is a schematic vertical cross-sectional view of the silicon carbide substrate portion of FIG. 11A along line B-B. Neighboring shielding implants 760 leave gaps between them. Portions of the first epitaxial layer 780 between neighboring shielding implants 760 form connection portions 1311 of the drift layer 731. A second epitaxial layer 790 is grown by epitaxy on the first epitaxial surface 781.

Figure 12:
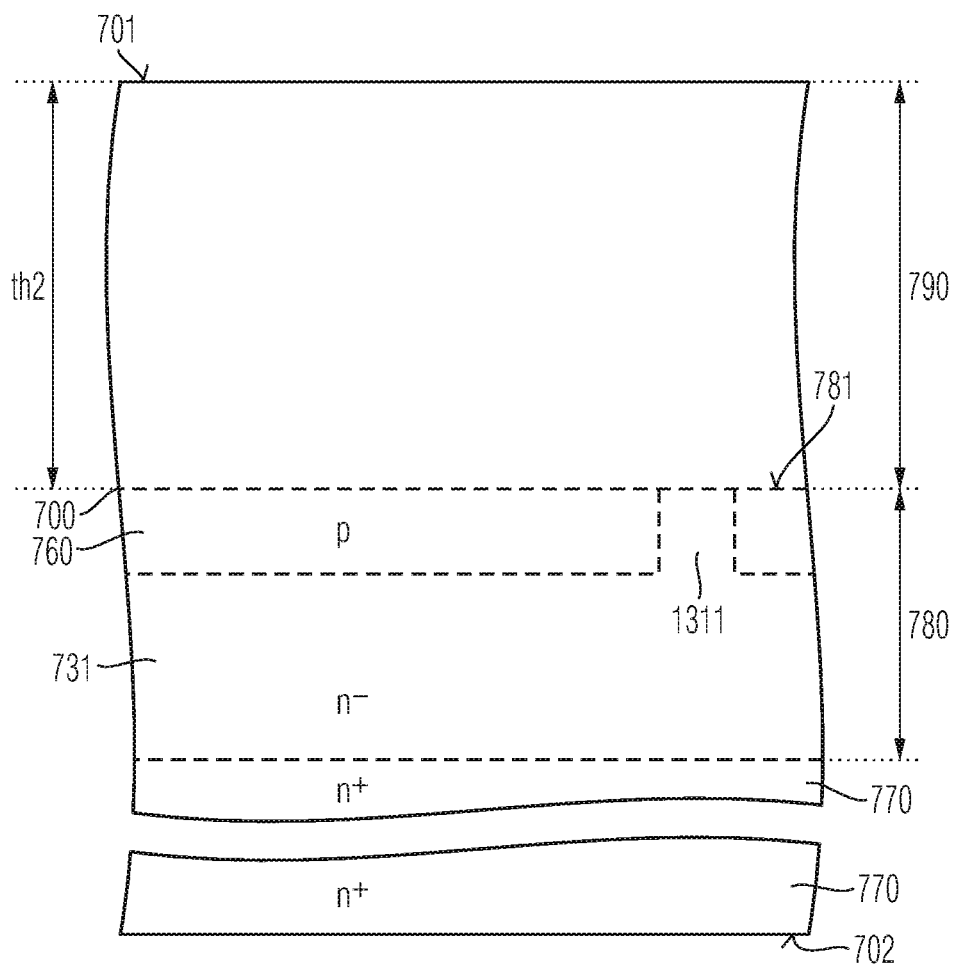
FIG. 12 is a schematic vertical cross-sectional view of the silicon carbide substrate of FIG. 11B, after forming a second epitaxial layer.

According to FIG. 12 the base substrate 770, the first epitaxial layer 780 and the second epitaxial layer 790 form a silicon carbide substrate 700 with the exposed second epitaxial surface of the second epitaxial layer 790 forming a main surface 701 at a front side and the exposed main surface of the base substrate 770 forming a rear side surface 702 on the back. A second layer thickness th2 of the second epitaxial layer 790 is defined by a target depth of trench gate structures and may be in a range from 1 μm to 20 μm, for example, from 1.5 μm to 10 μm.

A background doping of the second epitaxial layer 790 may correspond to the background doping of channel regions of the finalized semiconductor devices. The second epitaxial layer 790 may be intrinsic, may be lightly n-doped or lightly p-doped.

According to another embodiment, the second epitaxial layer 790 is grown without background doping and the dopants for defining the channel regions may be introduced by an implant, for example by a high energy implant using an energy filter that distributes the implanted dopants homogeneously across the vertical extension of the second epitaxial layer 790.

Source trenches 710 and current spread trenches 732 may be etched from the main surface 701 into the silicon carbide substrate 700.

Figure 13A:
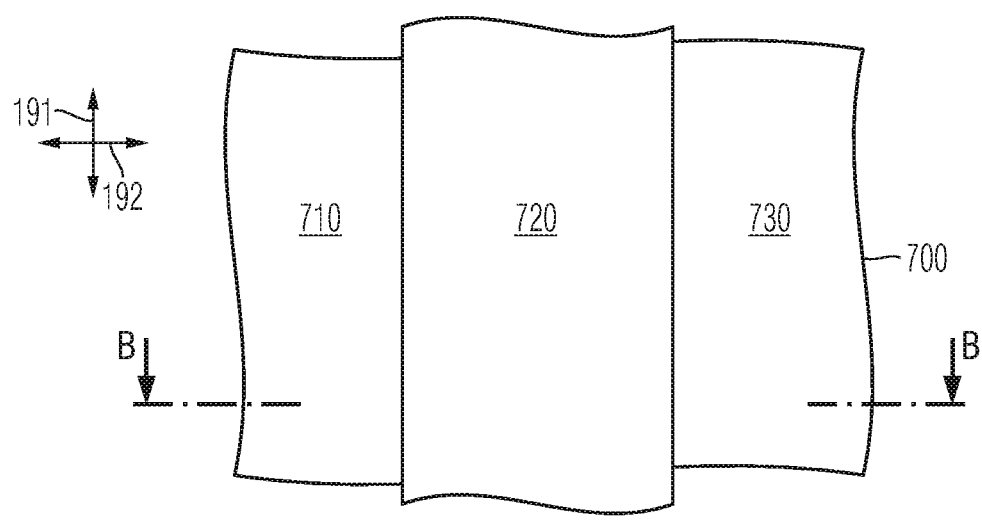
FIG. 13A is a schematic plan view of the silicon carbide substrate of FIG. 12, after forming source trenches and current spread trenches.
Figure 13B:
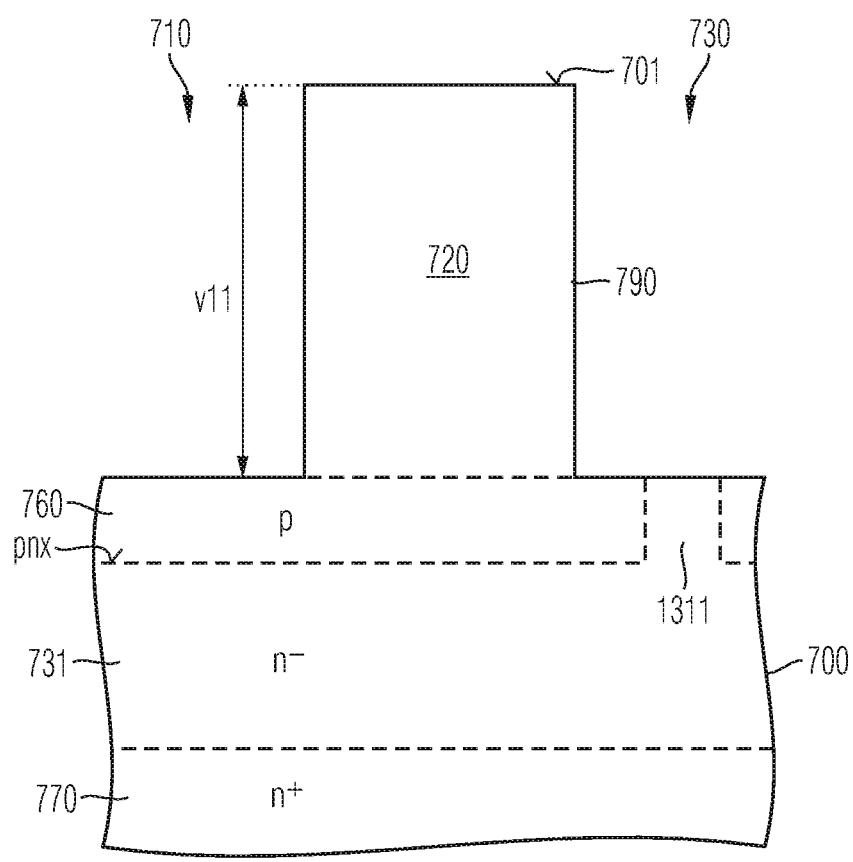
FIG. 13B is a schematic vertical cross-sectional view of the silicon carbide substrate portion of FIG. 13A along line B-B.

As illustrated in FIGS. 13A and 13B, a vertical trench extension v11 of the source trenches 710 and the current spread trenches 732 is equal to or greater than the second thickness th2 of the second epitaxial layer 790 such that the source trenches 710 expose the shielding implants 760 or extend into the shielding implants 760. Longitudinal axes of the source trenches 710 and the current spread trenches 732 extend along the first horizontal direction 191. The source trenches 710 are formed exclusively in a vertical projection of portions of the shielding implants 760 such that the shielding implants 760 separate the source trenches 710 from the drift layer 731.

The current spread trenches 732 expose the connection portions 1311 of the drift layer 731. Portions of the silicon carbide substrate 700 between the source trench 710 and the current spread trenches 732 form a channel mesa 720 which the shielding implant 760 completely separates from the drift layer 731.

The source trench 710 and the current spread trench 732 may be filled with heavily-doped semiconductor material, e.g., in a further epitaxy process with a background doping defining the dopant concentration in source regions and current spread regions of the finalized device.

Figure 14A:
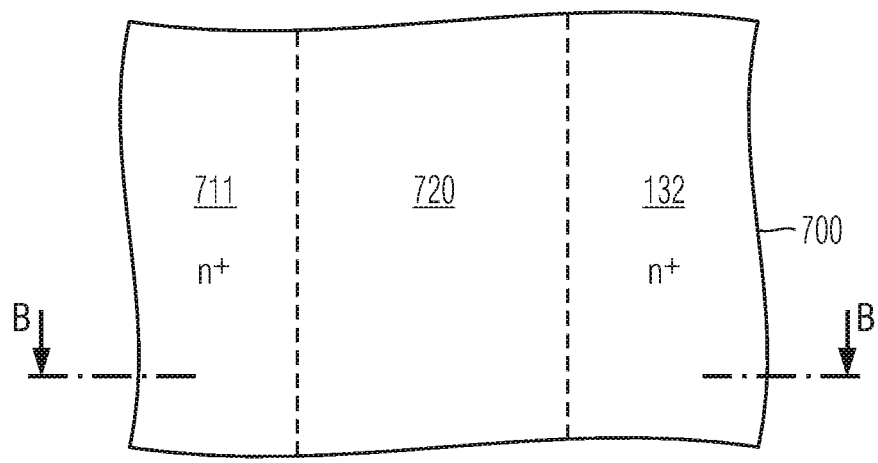
FIG. 14A is a schematic plan view of the silicon carbide substrate of FIG. 13A, after forming source columns and current spread regions.
Figure 14B:
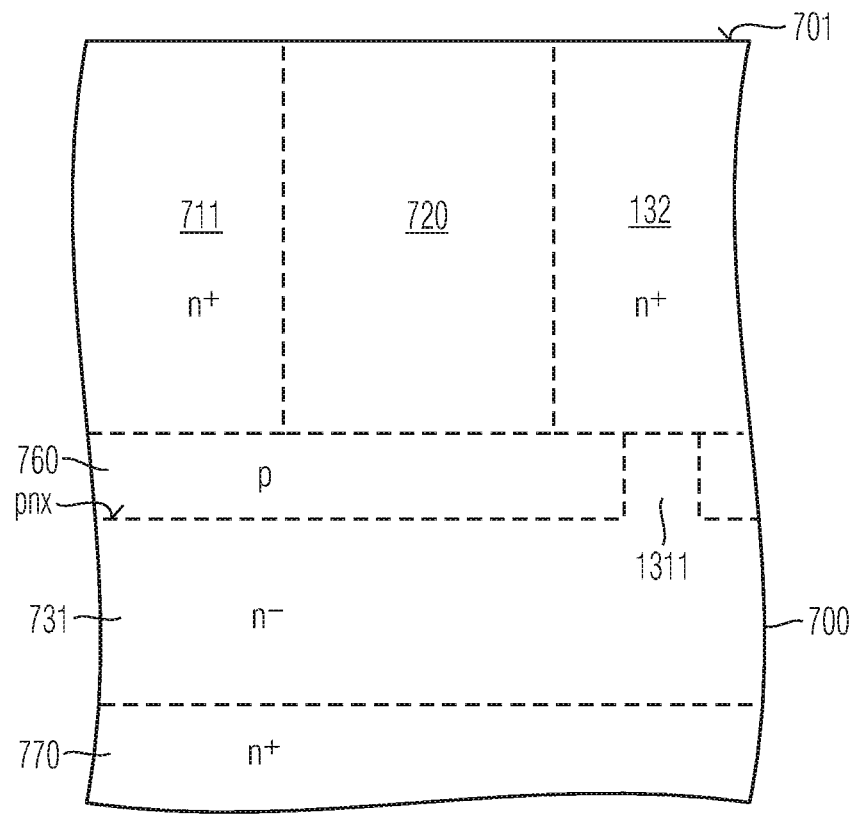
FIG. 14B is a schematic vertical cross-sectional view of the silicon carbide substrate portion of FIG. 14A along line B-B.

FIGS. 14A and 14B show a source column 711 in the vertical projection of the shielding implant 760 and a current spread region 132 in the vertical projection of the connection portion 1311 of the drift layer 731, wherein the current spread region 132 laterally overlap with two neighboring shielding implants 760.

According to an alternative embodiment, formation of the source columns 711 and of the current spread regions 132 may include implanting dopants into the second epitaxial layer 790 of FIGS. 12A and 12B, for example by using a high energy implant with an energy filter distributing the dopant atoms homogeneously across the complete vertical extension of the second epitaxial layer 790 such that the steps of etching the source trenches 710 and current spread trenches 732 of FIGS. 13A and 13B and filling the trenches by epitaxy may be omitted.

A heat treatment may anneal implant damages and may activate the implanted dopants to form, from the shielding implants 760 shielding regions 160. Gate trenches 750 are formed that extend from the main surface 701 into the silicon carbide substrate 700.

Figure 15A:
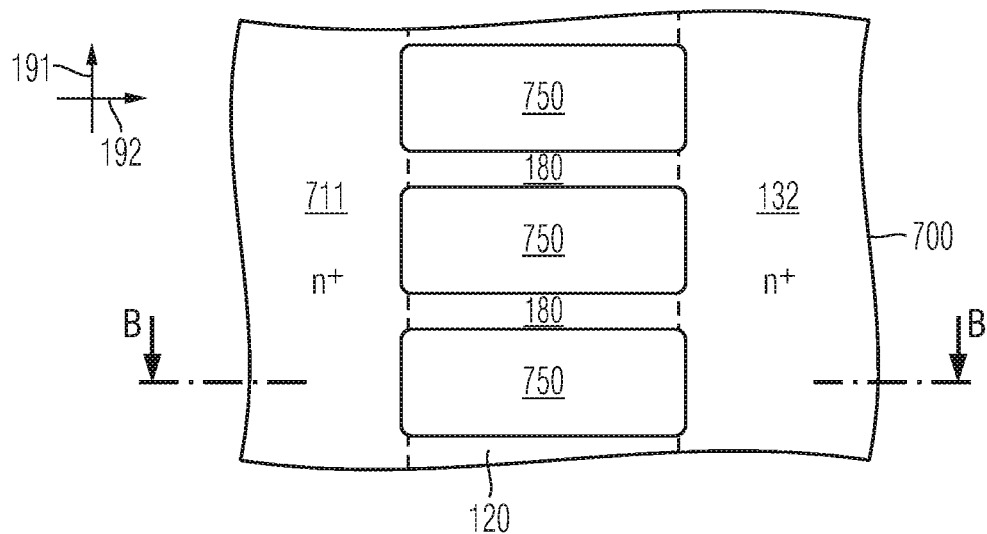
FIG. 15A is a schematic plan view of the silicon carbide substrate portion of FIG. 14A, after forming gate trenches.
Figure 15B:
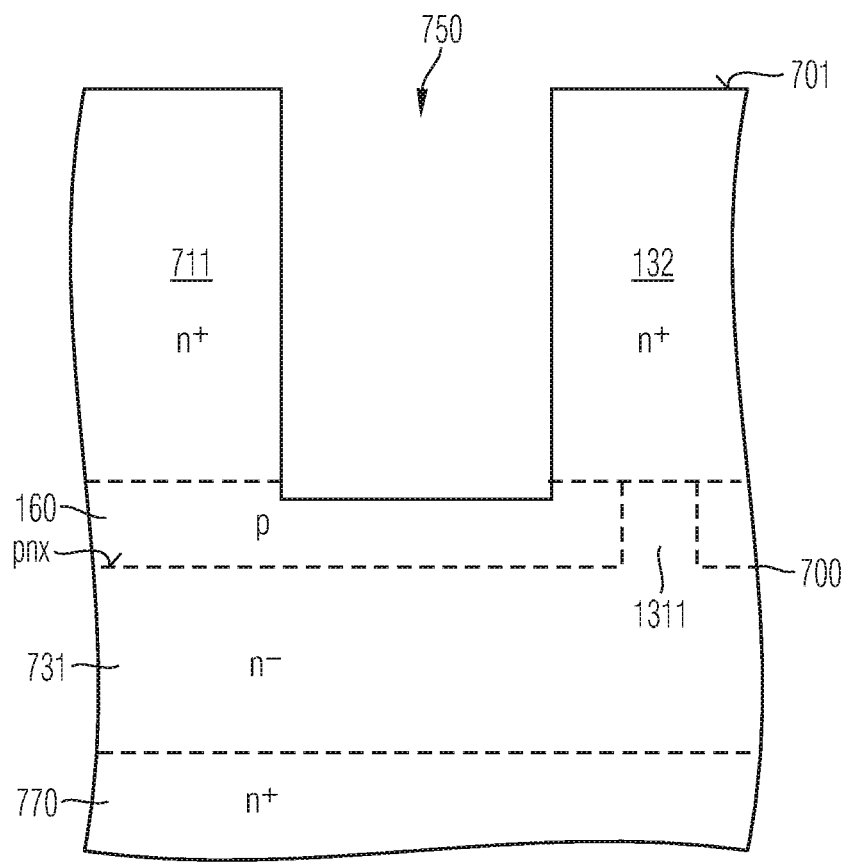
FIG. 15B is a schematic vertical cross-sectional view of the silicon carbide substrate portion of FIG. 15A along line B-B.

FIGS. 15A to 15B show the shielding regions 160 obtained by activating the dopants of the shielding implants 760 of FIGS. 14A to 14B. The shielding regions 160 form auxiliary pn junctions pnx with the drift layer 731.

The gate trenches 750 may be equally spaced and are arranged along a line parallel to the first horizontal direction 191. Portions of the silicon carbide substrate 700 between neighboring gate trenches 750 form mesa sections 180.

A lateral extension of the gate trenches 750 along a second horizontal direction 192 orthogonal the first horizontal direction may be smaller than a distance between the source column 711 and the current spread region 132, may be approximately the same or may be greater than the distance between the source column 711 and the current spread region 132.

A further process, for example, a suitable heat treatment in a suitable atmosphere may round the corners of the gate trenches 750 along the main surface 701 and along the bottom of the gates trenches 750. A gate dielectric 159 may be formed, wherein formation of the gate dielectric 159 may include thermal oxidation, deposition of one or more dielectric materials or a combination of deposition and thermal processes.

Figure 16A:
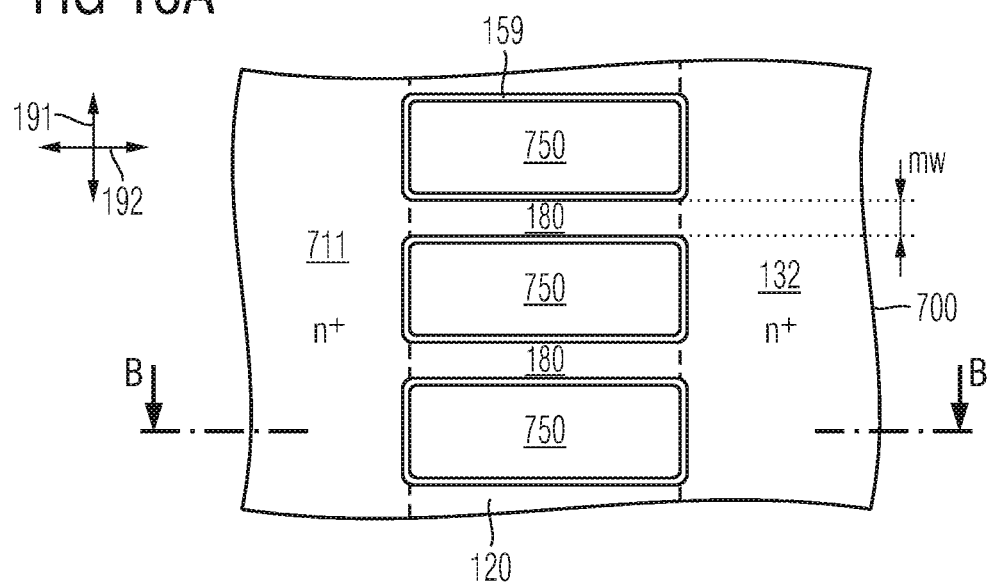
FIG. 16A is a schematic horizontal cross-sectional view of the silicon carbide substrate portion of FIG. 15A, after forming a gate dielectric.
Figure 16B:
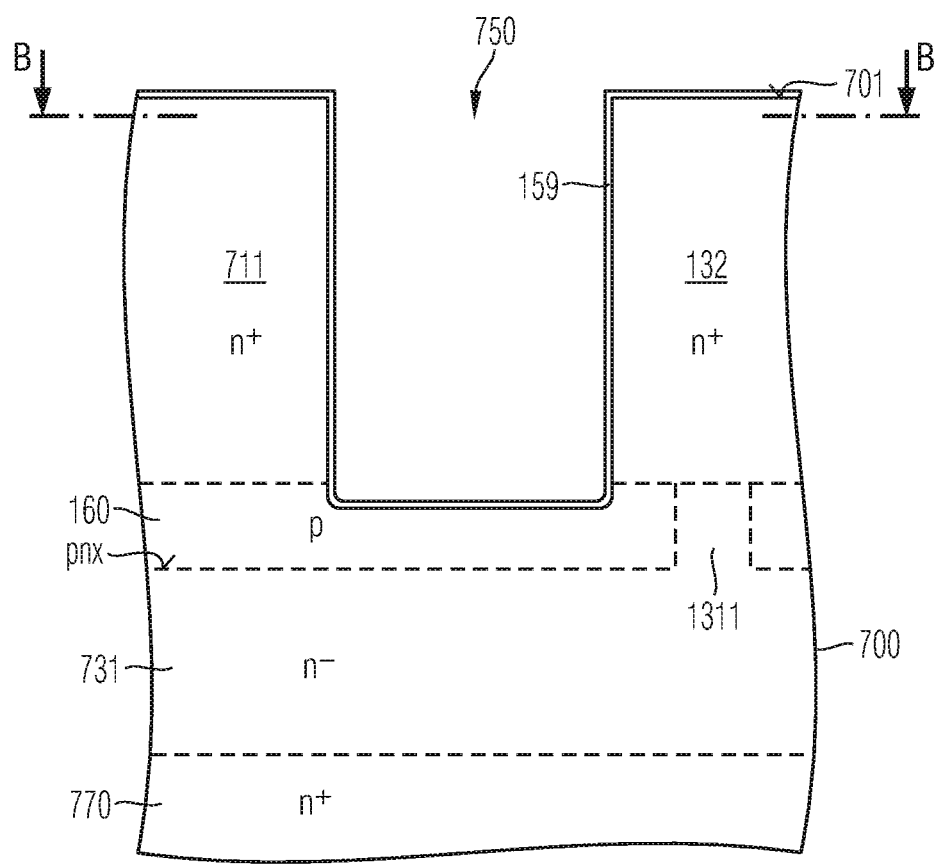
FIG. 16B is a schematic vertical cross-sectional view of the silicon carbide substrate portion of FIG. 16A along line B-B.

FIGS. 16A to 16B show the gate trenches 750 with rounded corners along the main surface 701 and at the bottom. The gate dielectric 159 may completely line the gate trenches 750. The gate dielectric 159 may include one single dielectric layer of, e.g., thermal or deposited silicon oxide or a combination of two or more layers including thermal and deposited silicon oxide, by way of example.

A distance between neighboring gate trenches 750 lined with the gate dielectric 159 defines a mesa width mw of the mesa sections 180 of the silicon carbide substrate 700 between the gate trenches 750. The mesa width mw may be at most 100 nm, for example at most 50 nm.

Conductive material is deposited and patterned by photolithography to form a gate electrode 155 in the gate trenches 750 of FIGS. 16A to 16B. The conductive material may be or may include heavily-doped polycrystalline silicon.

Figure 17A:
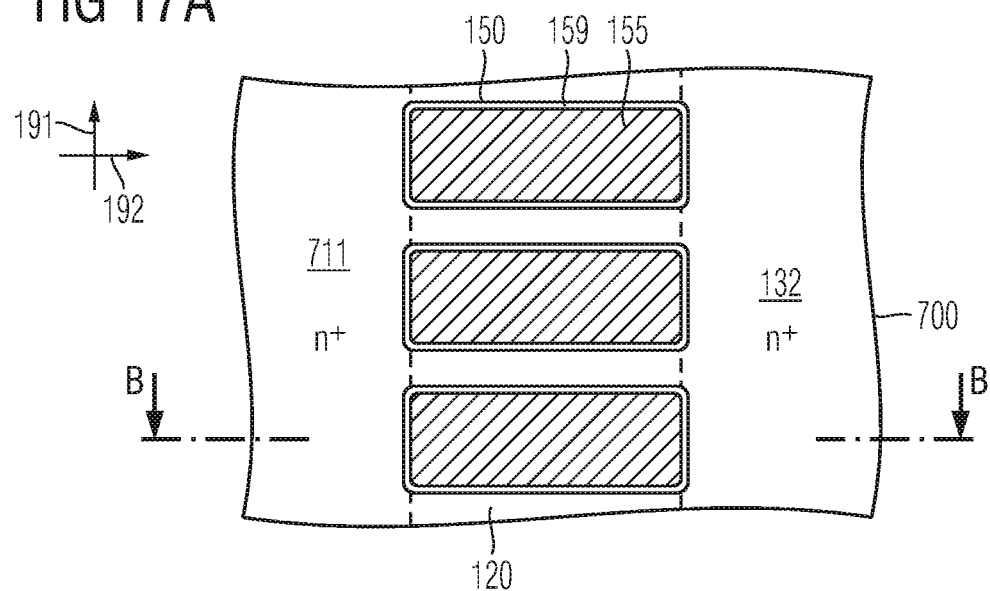
FIG. 17A is a schematic horizontal cross-sectional view of the silicon carbide substrate portion of FIG. 16A, after forming a gate electrode.
Figure 17B:
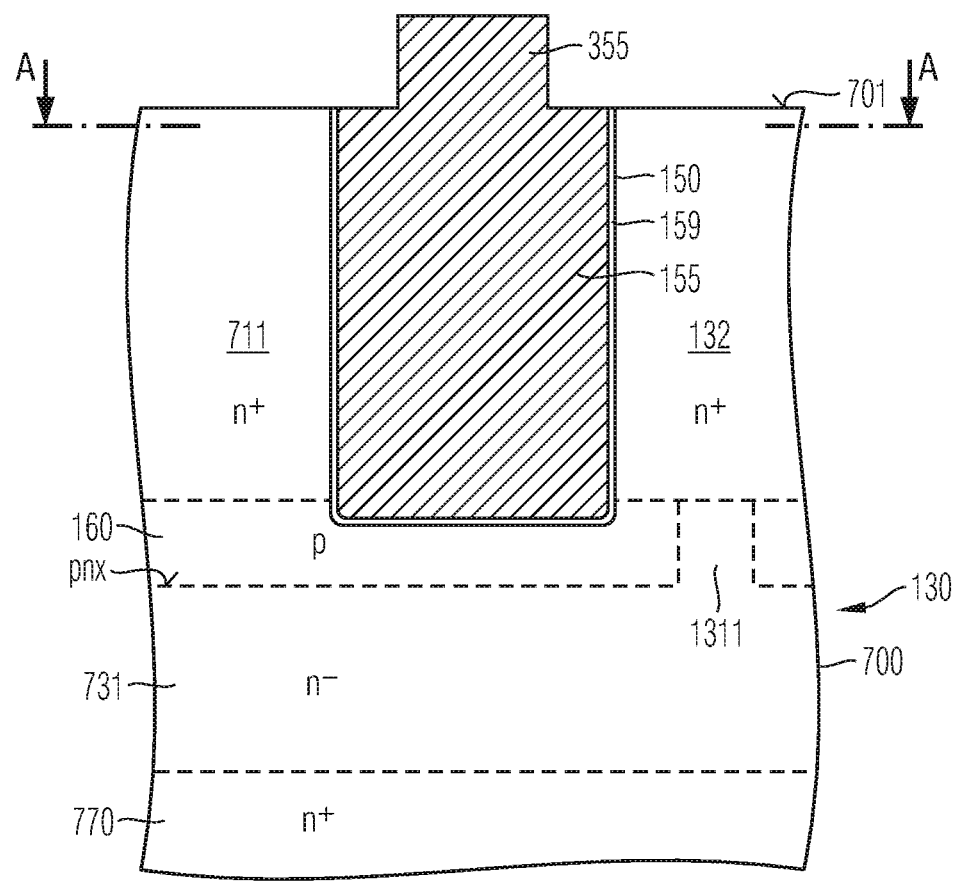
FIG. 17B is a schematic vertical cross-sectional view of the silicon carbide substrate portion of FIG. 17A along line B-B.

As illustrated in FIGS. 17A to 17B, the gate electrode 155 and the gate dielectric 159 form trench gate structures 150 extending from the main surface 701 into the silicon carbide substrate 700, for example, down to or into the shielding region 160.

Remnants of the deposited conductive material above the main surface 701 may form a gate connection line 355 connecting portions of the gate electrode 155 formed in the trench gate structures 150 of the same row. A recess of the gate electrode 155 on opposite sides of the gate connection line 355 may disable a portion of the transistor channel along the main surface 701 to avoid interferences with a parasitic device formed in the upper mesa sections below the gate connection line 355. Alternatively, a first deposition process may form the gate electrode 155, a portion of an interlayer dielectric is formed on the first surface 101 and patterned by photolithography to form a stripe-shaped opening exposing the gate electrode and further conductive material may be deposited in the stripe-shaped opening to form the gate connection lines 355.

A contact trench 715 may be formed that extends between two neighboring rows of trench gate structures 150 from the main surface 701 of the silicon carbide substrate 700 down to or into the shielding region 160.

Figure 18A:
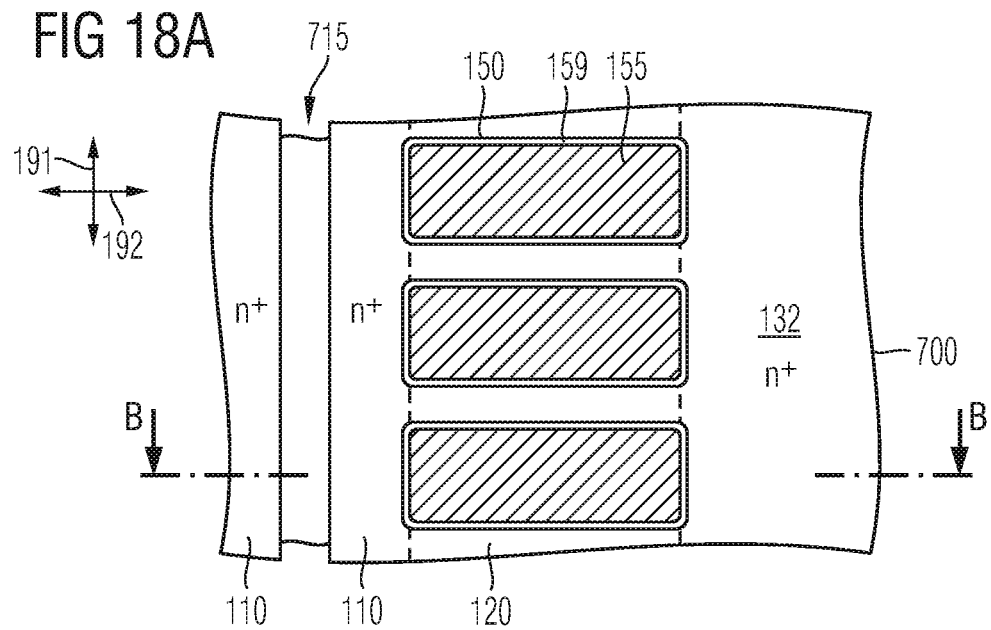
FIG. 18A is a schematic horizontal cross-sectional view of the silicon carbide substrate portion of FIG. 17A, after forming a source contact trench.
Figure 18B:
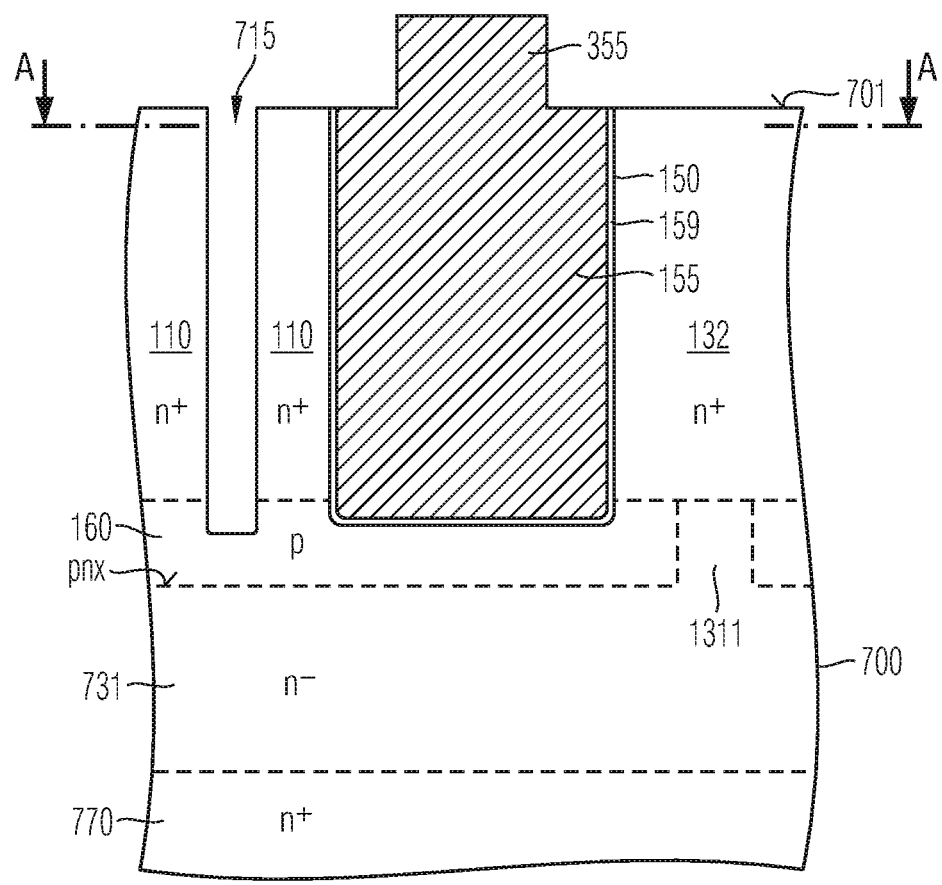
FIG. 18B is a schematic vertical cross-sectional view of the silicon carbide substrate of FIG. 18A along line B-B.

FIGS. 18A and 18B show the contact trench 715 exposing the shielding region 160. Formation of the contact trench 715 may split up the source column 711 of FIGS. 17A to 17B into two source regions 110 on opposite sides of the contact trench 715.

A deep source contact structure 315 may be formed in the contact trenches 715. Formation of the deep source contact structure 315 may include formation of a conductive liner 316 on the sidewalls and at the bottom of the contact trenches 715 and filling the lined contact trenches 715 with a second conductive material forming a fill portion 318.

An interlayer dielectric 200 may be deposited. A photolithography process may open the interlayer dielectric 200 in the vertical projection of the deep source contact structures 315. A first load electrode 310 may be formed on the interlayer dielectric 200. A second load electrode 320 may be formed on the back of the silicon carbide substrate 700, wherein the base substrate 770 may be thinned before formation of the second load electrode 320. The silicon carbide substrate 700 may be diced to obtain, from the processed silicon carbide substrate 700, a plurality of semiconductor dies of identical semiconductor devices 500.

Figure 19A:
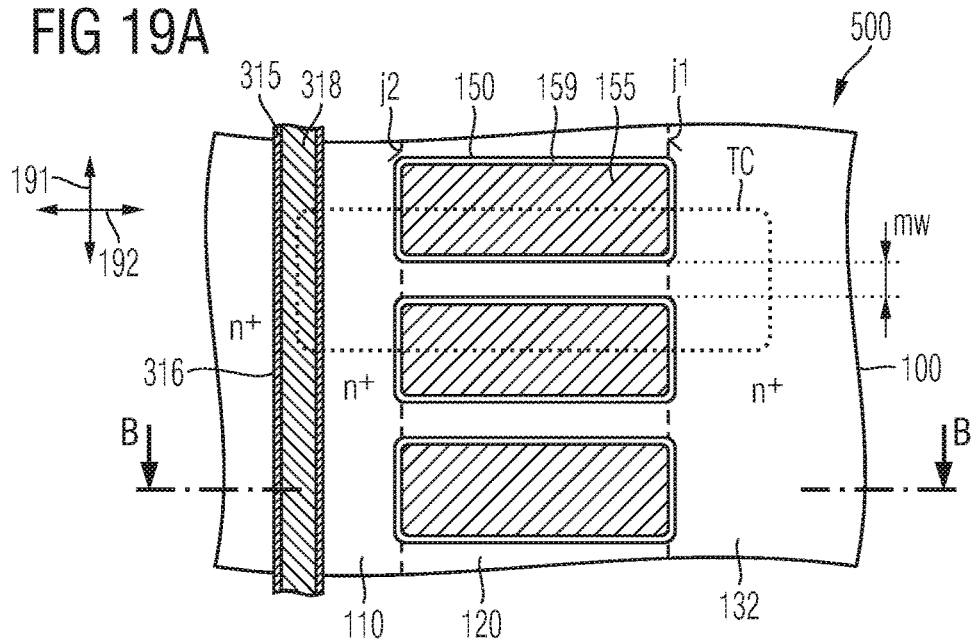
FIG. 19A is a schematic horizontal cross-sectional view of the silicon carbide substrate portion of FIG. 18A, after forming load electrodes on opposite sides.
Figure 19B:
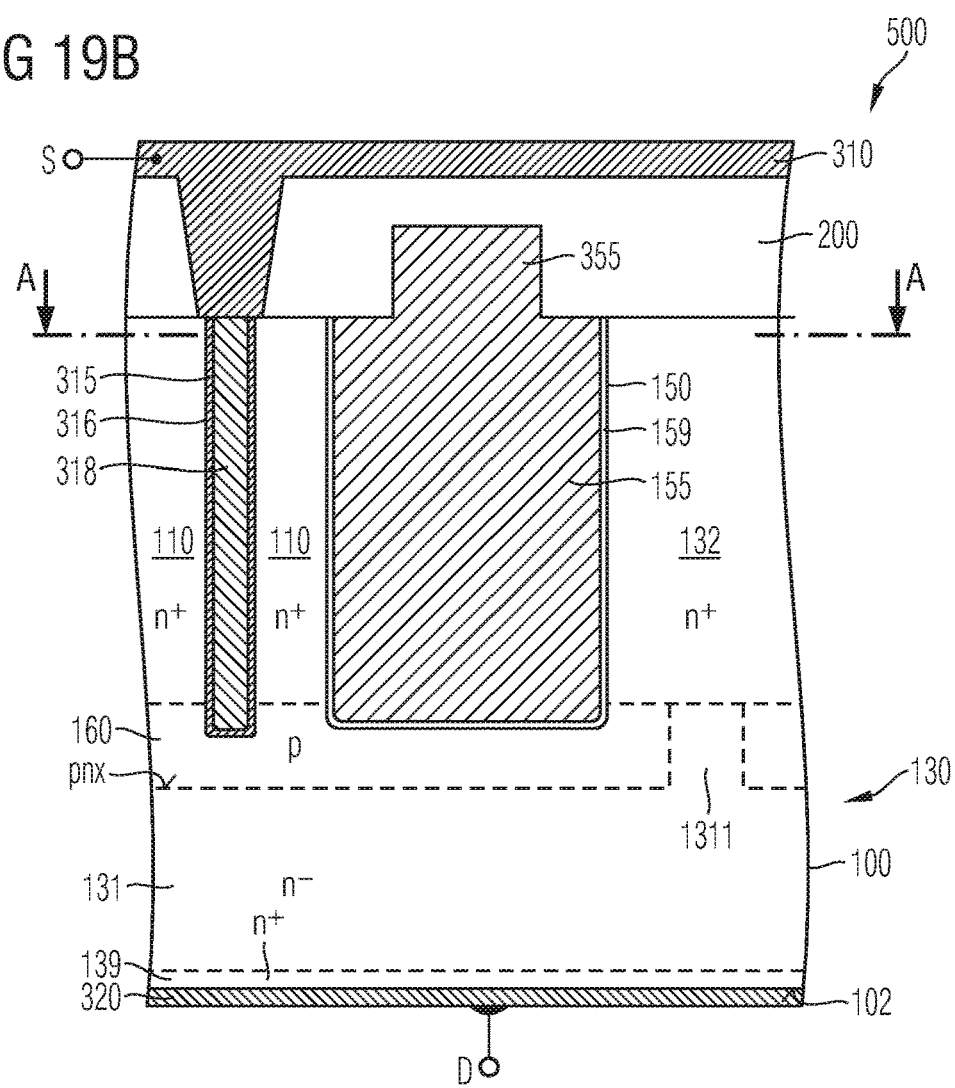
FIG. 19B is a schematic vertical cross-sectional view of the silicon carbide substrate portion of FIG. 19A along line B-B.

FIGS. 19A to 19B show a semiconductor device 500 obtained from the silicon carbide substrate 700 of FIGS. 18A to 18B. The conductive liner 316 may include a metal, for example a metal silicide. According to an embodiment, the conductive liner 316 includes a nickel silicide phase. The fill portion 318 of the source contact structures 315 may include heavily-doped, e.g. heavily p-doped polycrystalline silicon and/or a metal or metal compound.

Figure 20A:
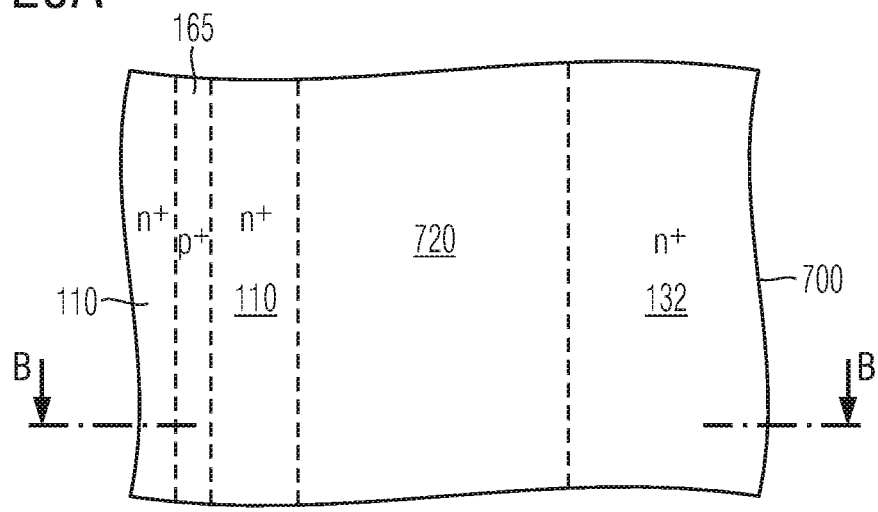
FIG. 20A is a schematic plan view of a portion of a silicon carbide substrate for illustrating a method of manufacturing semiconductor devices according to an embodiment related to the formation of heavily-doped channel contact regions, after forming the channel contact regions.
Figure 20B:
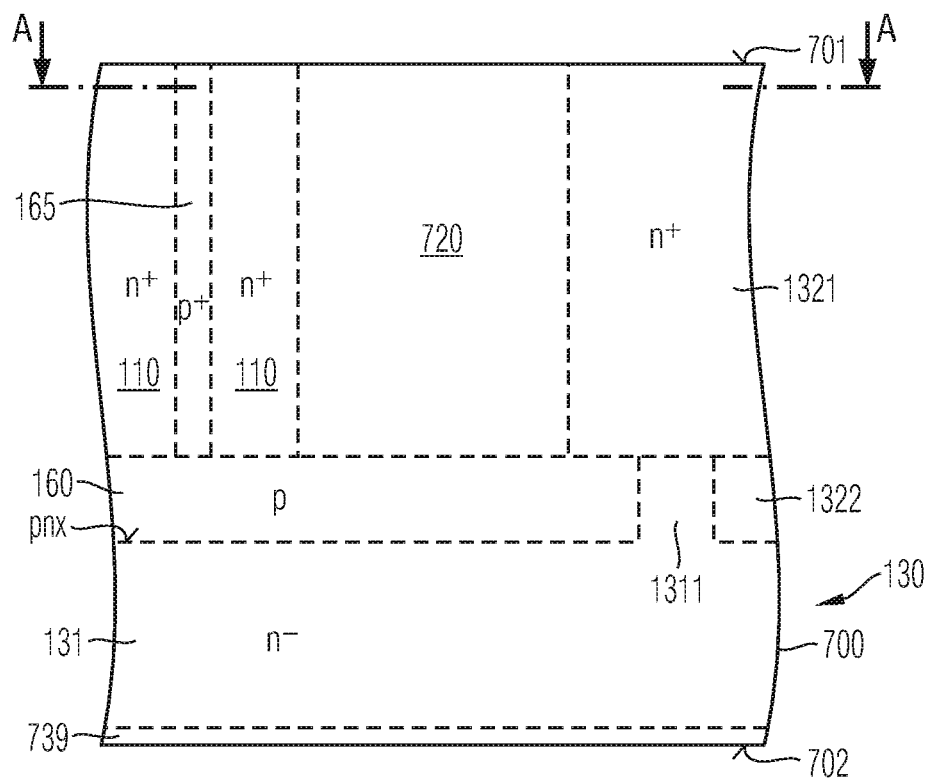
FIG. 20B is a schematic vertical cross-sectional view of the silicon carbide substrate of FIG. 20A along line B-B.

FIGS. 20A to 20B refer to an alternative process flow forming a heavily-doped channel contact region 165 extending from the main surface 701 down to or into the shielding implant 760. Formation of the channel contact region 165 may include a masked implant, e.g., before the heating treatment for activating the dopants as described with reference to FIGS. 15A and 15B. The alternative process flow may replace or may be combined with the deep source contact structure 315 of FIGS. 14A to 14B.

Although specific embodiments have been illustrated and described herein, it will be appreciated by those of ordinary skill in the art that a variety of alternative and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
   trench gate structures extending from a first surface into a silicon carbide portion;
   a shielding region formed between a drift zone and the trench gate structures along a vertical direction orthogonal to the first surface, the shielding region forming an auxiliary pn junction with the drift zone; and
   channel regions,
   wherein the channel regions and the trench gate structures are successively arranged along a first horizontal direction,
   wherein along a second horizontal direction orthogonal to the first horizontal direction, the channel regions are formed between a source region and a current spread region,
   wherein the channel regions are configured to fully deplete portions of mesa sections between neighboring trench gate structures at a gate voltage within an absolute maximum rating of the semiconductor device.

2. The semiconductor device of claim 1, wherein the channel regions are configured to fully deplete the portions of the mesa sections when the gate voltage is zero.

3. The semiconductor device of claim 1, wherein the channel regions are configured to form bulk channels comprising a charge carrier flow in central portions of the mesa sections when the gate voltage is greater than 2.5V and to suppress formation of the bulk channels when the gate voltage is less than 2.5V.

4. The semiconductor device of claim 1, wherein the channel regions form pn junctions with the source region.

5. The semiconductor device of claim 1, wherein the channel regions form n−/n junctions or p−/p junctions with the source region.

6. The semiconductor device of claim 1, wherein the source region adjoins the trench gate structures.

7. The semiconductor device of claim 1, wherein the source region is spaced apart from the trench gate structures.

8. The semiconductor device of claim 1, wherein the current spread region adjoins the trench gate structures.

9. The semiconductor device of claim 1, wherein the current spread region comprises a heavily-doped portion and a lightly-doped portion between the heavily-doped portion and the channel regions.

10. The semiconductor device of claim 1, wherein the current spread region is spaced apart from the trench gate structures.

11. The semiconductor device of claim 1, further comprising:
    lateral shielding portions of a conductivity type of the shielding region, the lateral shielding portions adjoining the trench gate structures at a side oriented to the current spread region.

12. The semiconductor device of claim 11, wherein the lateral shielding portions adjoin the shielding region.

13. The semiconductor device of claim 1, wherein the shielding region comprises an extension portion laterally extending beyond the trench gate structures along the second horizontal direction.

14. The semiconductor device of claim 1, further comprising:
    a source contact structure extending along the vertical direction from the first surface to the shielding region and laterally adjoining the source region.

15. The semiconductor device of claim 1, wherein the silicon carbide portion comprises:
    a central area with a central vertical extension and comprising the trench gate structures;
    an outer edge region with an outer vertical extension; and
    an inner edge region in which a vertical extension of the silicon carbide portion falls from the central vertical extension to the outer vertical extension.

16. The semiconductor device of claim 15, further comprising:

a junction termination extension in an edge area comprising the inner edge region and the outer edge region.

17. The semiconductor device of claim 16, wherein the junction termination extension laterally adjoins the shielding region.

18. The semiconductor device of claim 16, wherein the junction termination extension adjoins the first surface in a portion of the outer edge region.

19. The semiconductor device of claim 1, wherein a mesa width of the mesa sections along the first horizontal direction is at most 50 nm.

20. A semiconductor device, comprising:
trench gate structures extending from a first surface into a silicon carbide portion;
a shielding region formed between a drift zone and the trench gate structures along a vertical direction orthogonal to the first surface, the shielding region forming an auxiliary pn junction with the drift zone; and
channel regions,
wherein the channel regions and the trench gate structures are successively arranged along a first horizontal direction,
wherein along a second horizontal direction orthogonal to the first horizontal direction, the channel regions are formed between a source region and a current spread region,
wherein the channel regions are configured to form bulk channels comprising charge carrier flow in central portions of mesa sections between neighboring trench gate structures at a gate voltage within an absolute maximum rating of the semiconductor device.

21. A method of manufacturing a semiconductor device, the method comprising:
forming, in a silicon carbide substrate, a shielding region that forms an auxiliary pn junction with a drift zone;
forming, in a portion of the silicon carbide substrate between a main surface and the shielding region, a source region and a current spread region, longitudinal axes of the source region and the current spread region running parallel to a first horizontal direction;
forming, between the source region and the current spread region, trench gate structures extending from the main surface into the silicon carbide substrate,
wherein the trench gate structures alternate with mesa sections of the silicon carbide substrate along the first horizontal direction,
wherein a mesa width of the mesa sections is at most 50 nm.

22. The method of claim 21, wherein forming the shielding region comprises:
forming a first epitaxial layer on a base substrate; and
implanting dopants through a first epitaxial surface of the first epitaxial layer.

23. The method of claim 22, wherein the portion of the silicon carbide substrate between the main surface and the shielding region is formed by forming a second epitaxial layer on the first epitaxial surface.

24. The method of claim 21, wherein forming the source regions and the current spread regions comprises:
forming source trenches and current spread trenches in the silicon carbide substrate; and
filling the source trenches and the current spread trenches by epitaxy.

* * * * *